US012354923B2

(12) United States Patent
Hogyoku et al.

(10) Patent No.: US 12,354,923 B2
(45) Date of Patent: Jul. 8, 2025

(54) SEMICONDUCTOR DEVICE

(71) Applicant: SONY SEMICONDUCTOR SOLUTIONS CORPORATION, Kanagawa (JP)

(72) Inventors: Susumu Hogyoku, Kanagawa (JP); Shinya Morita, Kanagawa (JP); Rei Takamori, Kumamoto (JP); Shuichi Oka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 371 days.

(21) Appl. No.: 17/906,873

(22) PCT Filed: Mar. 16, 2021

(86) PCT No.: PCT/JP2021/010492
§ 371 (c)(1),
(2) Date: Sep. 21, 2022

(87) PCT Pub. No.: WO2021/200094
PCT Pub. Date: Oct. 7, 2021

(65) Prior Publication Data
US 2023/0135956 A1 May 4, 2023

(30) Foreign Application Priority Data
Mar. 31, 2020 (JP) ................................. 2020-065040

(51) Int. Cl.
*H01L 23/15* (2006.01)
*H01L 21/8238* (2006.01)
(Continued)

(52) U.S. Cl.
CPC .............. *H01L 23/15* (2013.01); *H01L 23/10* (2013.01); *H01L 23/4006* (2013.01);
(Continued)

(58) Field of Classification Search
CPC ..... H01L 23/15; H01L 23/10; H01L 23/4006; H01L 23/53228; H10D 84/0165; H10D 84/038
See application file for complete search history.

(56) References Cited

U.S. PATENT DOCUMENTS

2014/0015121 A1* 1/2014 Koizumi .............. H05K 1/0271
257/734
2015/0319852 A1* 11/2015 Min ....................... H05K 3/002
216/13
(Continued)

FOREIGN PATENT DOCUMENTS

JP 05-048231 A 2/1993
JP 2006-024891 A 1/2006
(Continued)

OTHER PUBLICATIONS

International Search Report and Written Opinion of PCT Application No. PCT/JP2021/010492, issued on Jun. 22, 2021, 10 pages of ISRWO.

*Primary Examiner* — Peniel M Gumedzoe
(74) *Attorney, Agent, or Firm* — CHIP LAW GROUP

(57) ABSTRACT

Provided is a semiconductor device enabling the flatness of a glass substrate to be maintained and enabling the end portion of the glass substrate to be sufficiently protected. A semiconductor device according to the present disclosure includes a glass substrate that includes a first surface, a second surface provided on the opposite side of the first surface, and a first side surface provided between the first surface and the second surface, a wiring that is provided on the first and second surfaces, a metal film that covers the first side surface, and a frame that is provided further on the outer side than the metal film, and that is bonded to the metal film at the first side surface.

16 Claims, 22 Drawing Sheets

(51) Int. Cl.
    *H01L 23/10*     (2006.01)
    *H01L 23/40*     (2006.01)
    *H01L 23/532*     (2006.01)
    *H10D 84/01*     (2025.01)
    *H10D 84/03*     (2025.01)

(52) U.S. Cl.
    CPC ... *H01L 23/53228* (2013.01); *H10D 84/0165* (2025.01); *H10D 84/038* (2025.01)

(56) References Cited

U.S. PATENT DOCUMENTS

2019/0333850 A1    10/2019    Lin
2019/0378816 A1    12/2019    Arvin

FOREIGN PATENT DOCUMENTS

| JP | 2008-235869 A | 10/2008 |
| JP | 2014-022465 A | 2/2014 |
| JP | 2015-131741 A | 7/2015 |
| JP | 2015-151286 A | 8/2015 |
| JP | 5789889 B2 | 10/2015 |
| JP | 2016-208057 A | 12/2016 |
| JP | 6331127 B2 | 5/2018 |

* cited by examiner

SEMICONDUCTOR DEVICE

CROSS REFERENCE TO RELATED APPLICATIONS

This application is a U.S. National Phase of International Patent Application No. PCT/JP2021/010492 filed on Mar. 16, 2021, which claims priority benefit of Japanese Patent Application No. JP 2020-065040 filed in the Japan Patent Office on Mar. 31, 2020. Each of the above-referenced applications is hereby incorporated herein by reference in its entirety.

TECHNICAL FIELD

The present disclosure relates to a semiconductor device.

BACKGROUND ART

A glass substrate is promising as a substrate for a semiconductor device such as an optical component and a radio-frequency component since a semiconductor processing technology can be applied to the glass substrate, and the glass substrate has high surface flatness. In order to put the glass substrate into practical use as a semiconductor substrate, it is necessary to maintain the flatness of the glass substrate and to suppress cracking of the end portion thereof. Therefore, protection of the glass substrate is important.

CITATION LIST

Patent Document

Patent Document 1: Japanese Patent No. 6331127
Patent Document 2: Japanese Patent No. 5789889

SUMMARY OF THE INVENTION

Problems to be Solved by the Invention

There is a technology for covering the sidewall of a glass substrate with a resin material at the time of cutting and processing the glass substrate (Patent Document 1). However, the resin material does not have sufficiently high rigidity to protect the glass substrate, which makes it difficult to perform highly accurate processing while maintaining the flatness of the glass substrate. Also, since the glass substrate is held only by adhesion between the resin material and the glass substrate, there is a possibility that the glass substrate is warped by an external force, or that the resin material and the glass substrate are separated from each other.

In such a case, for example, in a case where a complementary metal oxide semiconductor (CMOS) image sensor is implemented on the glass substrate, optical axes of the CMOS image sensor and the optical lens may be misaligned due to the warpage of the glass substrate. Furthermore, the end portion of the glass substrate may crack, which may lower the reliability of the semiconductor device.

Therefore, the present disclosure provides a semiconductor device enabling the flatness of a glass substrate to be maintained and enabling the end portion of the glass substrate to be sufficiently protected.

Solutions to Problems

A semiconductor device according to an aspect of the present disclosure includes a glass substrate that includes a first surface, a second surface provided on the opposite side of the first surface, and a first side surface provided between the first surface and the second surface, a wiring that is provided on the first and second surfaces, a metal film that covers the first side surface, and a frame that is provided further on the outer side than the metal film, and that is bonded to the metal film at the first side surface.

The metal film may include the same material as that for the wiring.

The metal film may be provided on a side provided with the first surface and a side provided with the second surface from the glass substrate to the frame to cover both the glass substrate and the frame.

The frame may include a third surface provided on the side provided with the first surface, a fourth surface provided on the side provided with the second surface, and a second side surface provided between the third surface and the fourth surface and opposed to the first side surface, and the metal film may be provided from the first surface to the third surface and may be provided from the second surface to the fourth surface at a boundary portion between the glass substrate and the frame.

The height difference between the first surface and the third surface and the height difference between the second surface and the fourth surface may each be smaller than the thickness of the metal film.

The frame may have a hole penetrating from the third surface to the fourth surface.

The inner wall of the hole may be covered with a metal material, and the metal material may electrically be connected to the wiring or the metal film.

A screw may be provided in the hole, and the screw may attach the frame and a housing to each other.

The metal film may be used as an antenna for wireless communication. The wiring may be used as an antenna for wireless communication, and the metal film may be used as a ground.

The metal film may be provided on an outer side surface of the frame and may be used as an antenna for wireless communication.

The metal film provided on the outer side surface of the frame may be used as a slot antenna having one or a plurality of slits.

A semiconductor chip may be mounted on the first surface of the glass substrate.

The glass substrate may include an opening portion penetrating from the first surface to the second surface, and a metal plate and a semiconductor chip provided on the metal plate may be provided in the opening portion.

The metal plate may be a heat dissipation plate, and the semiconductor chip may be an image sensor chip.

The frame may include a third surface provided on a side provided with the first surface and a fourth surface provided on a side provided with the second surface, and may include a hole penetrating from the third surface to the fourth surface, a screw provided in the hole may attach the frame and a housing to each other, and the housing may be provided with an optical lens, and the optical lens may collect light onto the image sensor chip.

MODE FOR CARRYING OUT THE INVENTION

Hereinafter, specific embodiments to which the present technology has been applied will be described in detail with reference to the drawings. The drawings are schematic or conceptual, and the ratio or the like of respective components is not necessarily the same as actual one. In the description and the drawings, similar components to those that have been described with reference to the previously described drawings are labeled with the same reference signs, and the detailed description thereof is omitted as needed.

First Embodiment

Figure 1:
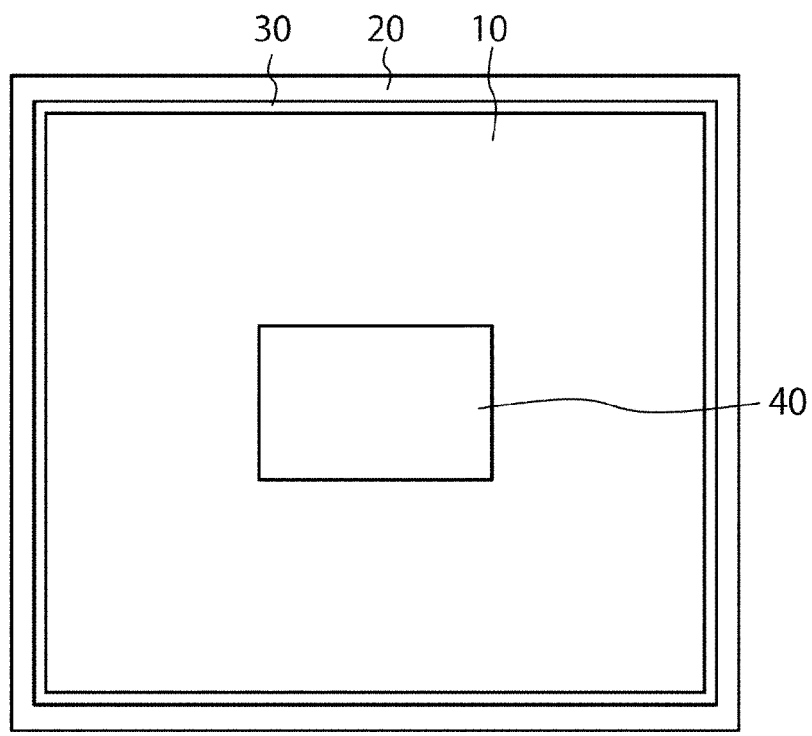
FIG. 1 is a schematic plan view illustrating a configuration example of a semiconductor device according to a first embodiment.
Figure 2:
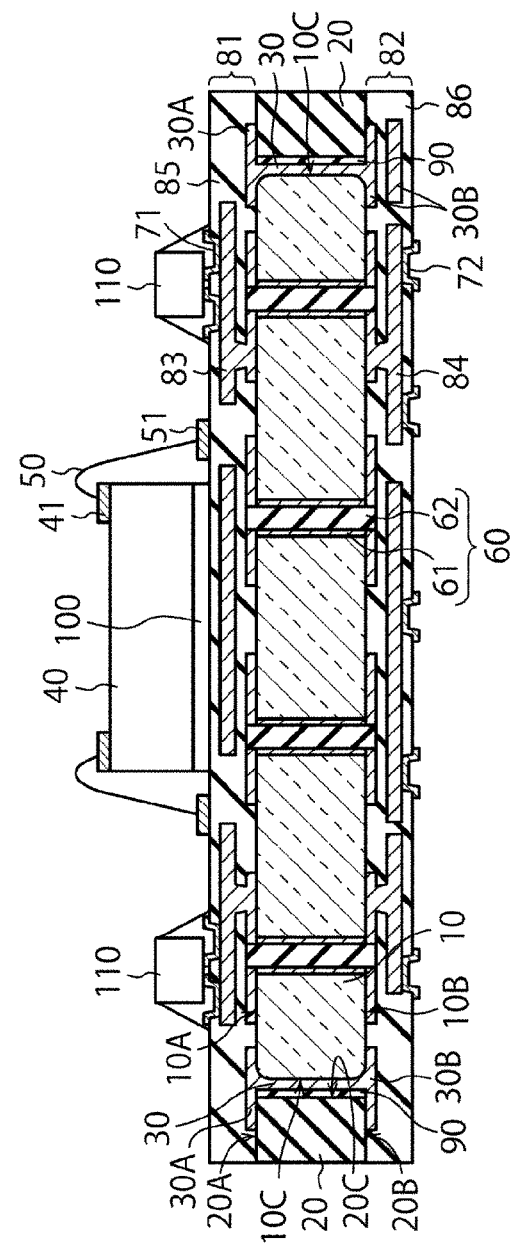
FIG. 2 is a schematic cross-sectional view illustrating the configuration example of the semiconductor device according to the first embodiment.

FIG. 1 is a schematic plan view illustrating a configuration example of a semiconductor device (hereinafter also referred to as a package or a module) according to a first embodiment. FIG. 2 is a schematic cross-sectional view illustrating the configuration example of the semiconductor device according to the first embodiment. Note that FIG. 1 illustrates a positional relationship among a glass substrate 10, a frame 20, a metal film 30, and a semiconductor chip 40, and does not illustrate in detail components such as a through electrode.

As illustrated in FIG. 1, the semiconductor chip 40 is mounted on the central portion of the glass substrate 10. The metal film 30 and the frame 20 are provided around the glass substrate 10 so as to continuously cover the entire side surface of the glass substrate 10. The semiconductor chip 40 is not particularly limited, but may be, for example, a CMOS image sensor chip. Note that the metal film 30 and the frame 20 may be provided so as to cover a part of the side surface of the glass substrate 10.

As illustrated in FIG. 2, the glass substrate 10 includes a first surface 10A, a second surface 10B provided on the opposite side of the first surface, and a side surface (first side surface) 10C provided between the first surface 10A and the second surface 10B. On the first surface 10A, a stacked wiring portion 81 is provided. The stacked wiring portion 81 includes a plurality of layers of wirings 83 provided on the first surface 10A. The wirings 83 are covered with an interlayer insulating film 85. A stacked wiring portion 82 includes a plurality of layers of wirings 84 provided on the second surface 10B. The wirings 84 are covered with an interlayer insulating film 86. For the wirings 83 and 84, a low-resistance metal material such as copper is used, for example.

A part of the wirings 83 is electrically connected to an electrode pad 71 on the first surface 10A. A part of the wirings 84 is electrically connected to an electrode pad 72 on the second surface 10B. The electrode pads 71 and 72 are connected to an electronic component 110 and the like, or connected to other not-illustrated substrates and components.

Also, another part of the wirings 83 is electrically connected to a bonding pad 51, and is electrically connected to the semiconductor chip 40 via the bonding pad 51 and a bonding wire 50.

On the side surface 10C of the glass substrate 10, the metal film 30 is provided. As illustrated in FIG. 1, the metal film 30 is provided on the entire outer edge of the glass substrate 10. As illustrated in FIG. 2, the metal film 30 is also provided so as to cover the entire side surface 10C from the first surface 10A to the second surface 10B. For the metal film 30, a low-resistance metal material such as copper is used, for example. The metal film 30 may include, for example, the same metal material as those for the wirings 83 and 84. Note that the metal film 30 does not have to be provided at a part of the outer edge of the glass substrate 10, and does not have to cover a part of the side surface 10C.

Further, the metal film 30 is provided on each of the first and second surfaces 10A and 10B from the glass substrate 10 to the frame 20 to cover both the glass substrate 10 and the frame 20. For example, the metal film 30 on the first surface 10A is a metal film (metal film portion) 30A, and the metal film 30 on the second surface 10B is a metal film (metal film portion) 30B. In this case, the metal film 30A is provided from the first surface 10A of the glass substrate 10 to a third surface 20A of the frame 20 at the boundary portion between the glass substrate 10 and the frame 20. The third surface 20A is a surface of the frame 20 on the side provided with the first surface 10A. The metal film 30B is provided from the second surface 10B of the glass substrate 10 to a fourth surface 20B of the frame 20 at the boundary portion between the glass substrate 10 and the frame 20. The fourth surface 20B is a surface of the frame 20 on the side provided with the second surface 10B.

In order for the metal film 30A to cover the boundary portion from the first surface 10A of the glass substrate 10 to the third surface 20A of the frame 20, the height difference between the first surface 10A and the third surface 20A is preferably smaller than the thickness of the metal film 30A. More preferably, the first surface 10A and the third surface 20A are substantially on the same plane. By doing so, the metal film 30A can continuously be provided from the first surface 10A of the glass substrate 10 to the third surface 20A of the frame 20.

In order for the metal film 30B to cover the boundary portion from the second surface 10B of the glass substrate 10 to the fourth surface 20B of the frame 20, the height difference between the second surface 10B and the fourth surface 20B is preferably smaller than the thickness of the metal film 30B. More preferably, the second surface 10B and the fourth surface 20B are substantially on the same plane. By doing so, the metal film 30B can continuously be provided from the second surface 10B of the glass substrate 10 to the fourth surface 20B of the frame 20.

In this manner, the metal film 30 is provided between the side surface 10C of the glass substrate 10 and the frame 20, and covers the boundary portion between the glass substrate 10 and the frame 20. Therefore, the metal film 30 protects the end portion and the side surface 10C of the glass substrate 10. Unlike a resin material, the metal film 30 can have sufficient rigidity to protect the glass substrate 10. Accordingly, the metal film 30 can sufficiently protect the end portion of the glass substrate 10. Alternatively, the metal film 30 may be used as a part of the wirings 83 and 84.

The frame 20 is provided further on the outer side than the metal film 30, and is bonded to the metal film 30 at the side surface 10C of the glass substrate 10 via an insulating film 90. The frame 20 includes the third surface 20A, the fourth surface 20B, and a side surface (second side surface) 20C provided between the third surface 20A and the fourth surface 20B. The side surface 20C is an inner side surface of the frame 20 and is a surface opposed to the side surface 10C. The frame 20 is bonded at the side surface 20C thereof to the metal film 30. As illustrated in FIG. 1, the frame 20 is provided so as to surround the entire outer edge of the glass substrate 10, and protects the side surface 10C of the glass substrate 10 together with the metal film 30. The metal film 30 is provided on the third and fourth surfaces 20A and 20B of the frame 20 as well. For the frame 20, an insulating resin material such as glass epoxy resin is used, for example. For the insulating film 90, an insulating resin material such as epoxy resin is used, for example.

The glass substrate 10 is provided with a through electrode (through glass via (TGV)) 60. The through electrode 60 includes a metal film 61 covering the inner wall of a via hole penetrating the glass substrate 10, and an insulating film 62 filling the inside of the metal film 61. For the metal film 61, a low-resistance metal material such as copper is used, for example. The metal film 61 may include the same material as those for the wirings 83 and 84. For the insulating film 62, an insulating material such as epoxy resin is used, for example. The metal film 61 is provided to electrically connect a part of the wirings 83 to a part of the wirings 84 via the via hole.

The semiconductor chip 40 and the electronic component 110 are mounted on the glass substrate 10. A bonding pad 41 of the semiconductor chip 40 is connected to the bonding pad 51 via the bonding wire 50. The electronic component 110 is connected to the electrode pad 71. The semiconductor chip 40 is bonded onto the interlayer insulating film 85 by an adhesive 100.

According to the present embodiment, the metal film 30 is provided between the side surface 10C of the glass substrate 10 and the frame 20, and covers the boundary portion between the glass substrate 10 and the frame 20. Therefore, the metal film 30 can protect the end portion and the side surface 10C of the glass substrate 10. Further, the frame 20 is bonded to the metal film 30 along the outer edge of the glass substrate 10. Accordingly, the glass side surface can be protected by a member having higher rigidity.

In the present embodiment, as illustrated in FIG. 2, the metal film 30B may include a plurality of wiring layers. For example, a plurality of wiring layers is left on the second surface 10B of the glass substrate 10 and the fourth surface 20B of the frame 20 to serve as the same wiring layers as those of the stacked wiring portion 82. As a result, the metal film 30B can be formed as the same wiring layers as those of the stacked wiring portion 82. Similarly, the metal film 30A may include the same plurality of wiring layers as that of the stacked wiring portion 81. In this manner, since each of the metal films 30A and 30B includes a plurality of wiring layers, the metal films 30A and 30B can more reliably protect the end portion of the glass substrate 10.

Also, since each of the metal films 30A and 30B is formed by the same layers as those of each of the stacked wiring portions 81 and 82, an additional manufacturing process is dispensed with, and the semiconductor device can easily be manufactured.

Second Embodiment

Figure 3:
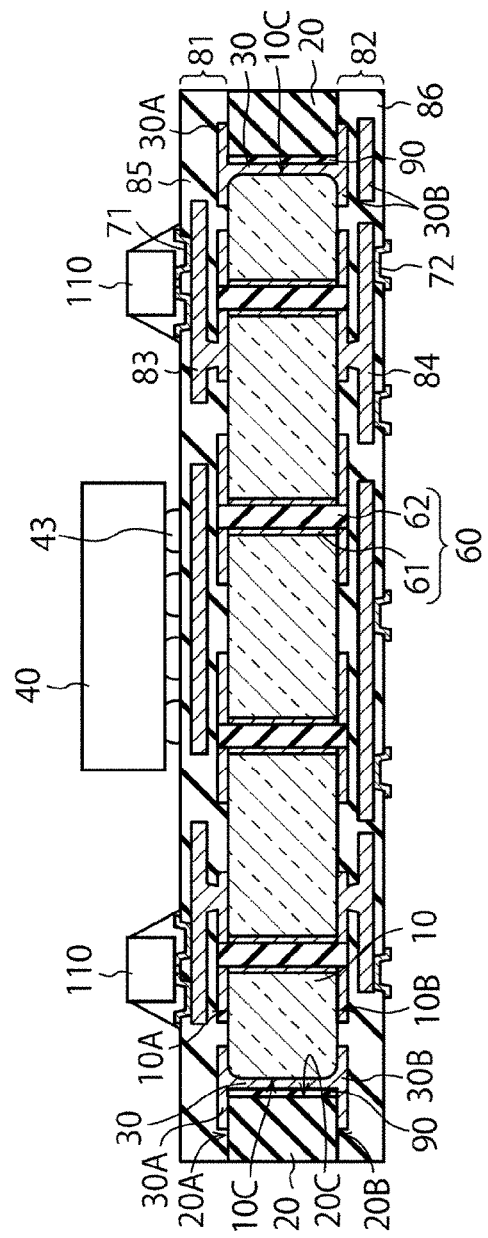
FIG. 3 is a schematic cross-sectional view illustrating a configuration example of a semiconductor device according to a second embodiment.

FIG. 3 is a schematic cross-sectional view illustrating a configuration example of a semiconductor device according to a second embodiment. In the second embodiment, the semiconductor chip 40 is flip-chip connected to a substrate for a semiconductor device. The semiconductor chip 40 includes a metal bump 43, and is connected to the stacked wiring portion 81 via the metal bump 43. That is, in the second embodiment, the semiconductor chip 40 is flip-chip connected on the upper side of the glass substrate 10. The other components of the second embodiment may be similar to the corresponding components of the first embodiment. Therefore, the second embodiment can exert similar effects to those of the first embodiment.

Third Embodiment

Figure 4:
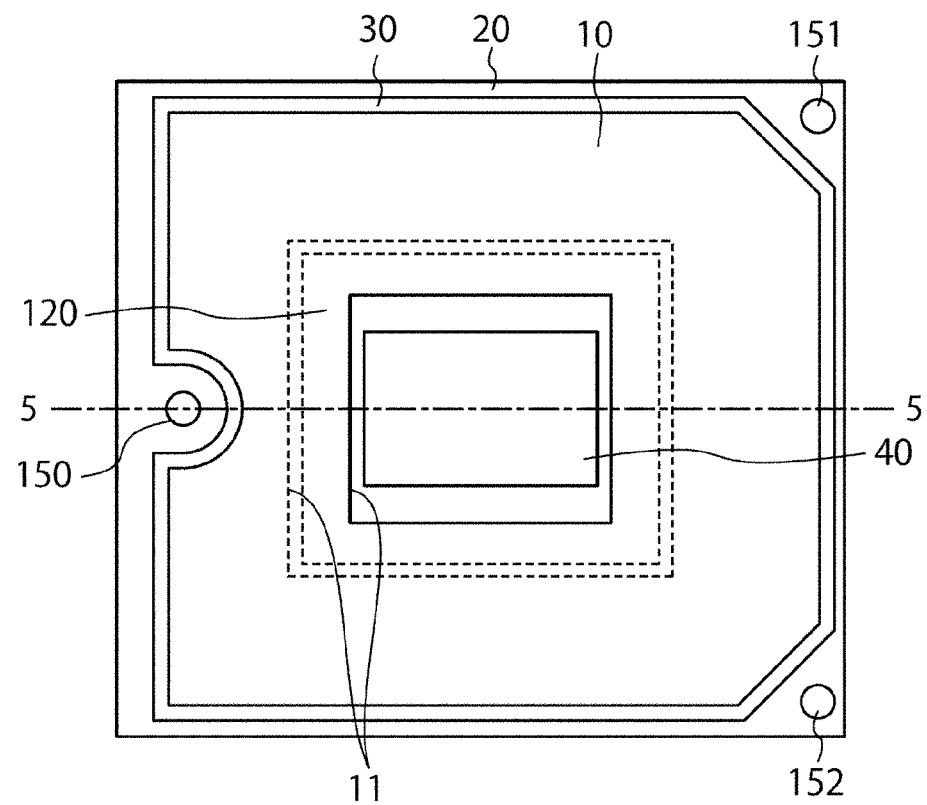
FIG. 4 is a schematic plan view illustrating a configuration example of a semiconductor device according to a third embodiment.
Figure 5:
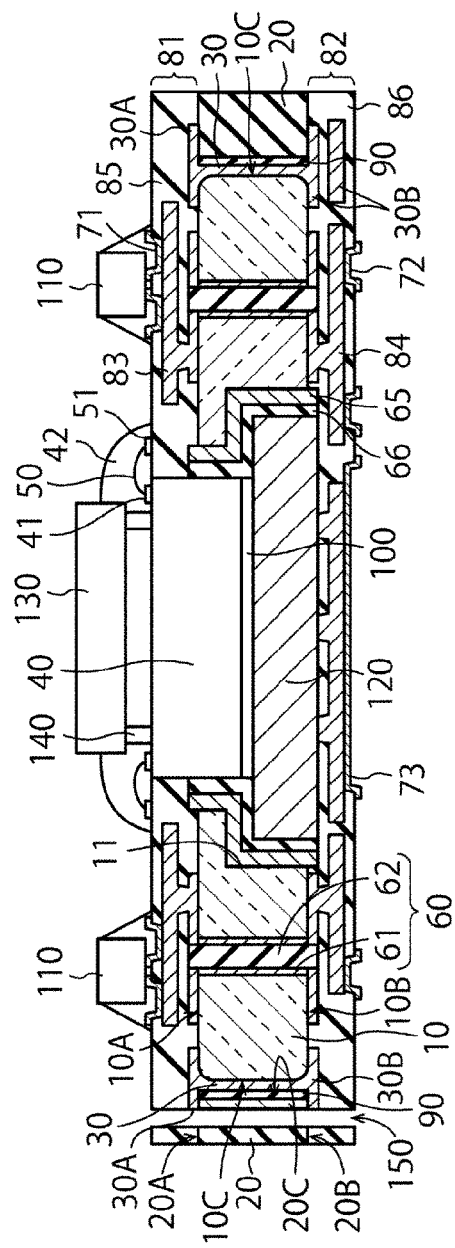
FIG. 5 is a schematic cross-sectional view illustrating the configuration example of the semiconductor device according to the third embodiment.

FIG. 4 is a schematic plan view illustrating a configuration example of a semiconductor device according to a third embodiment. FIG. 5 is a schematic cross-sectional view illustrating the configuration example of the semiconductor device according to the third embodiment. FIG. 5 illustrates a cross section taken along line 5-5 in FIG. 4.

In the third embodiment, the glass substrate 10 includes at the center thereof an opening portion 11 penetrating from the first surface 10A to the second surface 10B. The opening portion 11 is formed to have a sufficient size to receive the semiconductor chip 40 and a metal plate 120. Therefore, as illustrated in FIG. 4, the opening portion 11 is substantially in a similar shape to the semiconductor chip 40 or the metal plate 120 and is slightly larger in size than the semiconductor chip 40 or the metal plate 120 as viewed from the upper side of the first surface 10A of the glass substrate 10. In FIG. 4, the semiconductor chip 40 and the metal plate 120 are both quadrangular, and thus the opening portion 11 is also formed in a quadrangular shape.

As illustrated in FIG. 5, the semiconductor chip 40 is fitted in the upper portion of the opening portion 11. The metal plate 120 is fitted in the lower portion of the opening portion 11. In this manner, the metal plate 120 and the semiconductor chip 40 provided on the metal plate 120 are provided in the opening portion 11. The metal plate 120 is in contact with the rear surface of the semiconductor chip 40, absorbs heat generated in the semiconductor chip 40, and releases the heat from the side of the glass substrate 10 provided with the second surface 10B. That is, the metal plate 120 functions as a heat dissipation plate for the semiconductor chip 40. For the metal plate 120, a material having high heat conductivity such as copper is used, for example. The semiconductor chip 40 is bonded onto the metal plate 120 by the adhesive 100.

A metal film 65 is provided on the inner wall of the opening portion 11. An insulating film 66 is provided between the metal film 65 and the semiconductor chip 40 and between the metal film 65 and the metal plate 120. The insulating film 66 bonds the semiconductor chip 40 and the metal plate 120 to the metal film 65. For the metal film 65, a material having high heat conductivity such as copper is used, for example. The metal film 65 is, for example, copper plating. The metal film 65 covers at least a part of the side surface of the opening portion 11, and has a function of transferring heat of the semiconductor chip 40 from the side surface and dissipating the heat.

As illustrated in FIGS. 4 and 5, as viewed from above the first surface 10A, the outer size of the metal plate 120 is larger than the outer size of the semiconductor chip 40, and the entire bottom surface of the semiconductor chip 40 is in contact with the metal plate 120. Therefore, the metal plate 120 can efficiently dissipate the heat of the semiconductor chip 40.

Also, for example, in a case where the semiconductor chip 40 is a digital signal processor (DSP) or the like, the metal plate 120 can protect the semiconductor chip 40 from surrounding noise. This facilitates the design of the package of the semiconductor chip 40.

Also, the Young's modulus or the heat expansion coefficient of the frame 20 can be different from those of the glass substrate 10. By doing so, in a case where the metal plate 120 is fitted, the stress of the entire package can be adjusted.

A protective resin 42 covers the bonding wire 50 and the bonding pads 41 and 51 to protect the bonding wire 50 and the bonding pads 41 and 51. For the protective resin 42, an insulating resin material such as epoxy resin is used, for example.

A cover glass 130 is provided above the semiconductor chip 40. The cover glass 130 transmits light coming from above the first surface 10A of the glass substrate 10 to the semiconductor chip (for example, a CMOS image sensor chip) 40. Also, the cover glass 130 is provided to protect the sensor surface of the semiconductor chip 40. The cover glass 130 is supported at a portion above the semiconductor chip 40 by a rib 140.

In the third embodiment, as illustrated in FIG. 4, three holes 150 to 152 are provided at two corners and a middle portion of a side of the frame 20. As illustrated in FIG. 5, the holes 150 to 152 penetrate from the third surface 20A to the fourth surface 20B of the frame 20. Note that, in FIG. 5, only the hole 150 is illustrated. The holes 150 to 152 penetrate the frame 20 and the interlayer insulating films 85 and 86, and are provided to attach the frame 20 to another member with screws.

The holes 150 to 152 are provided in the frame 20, and are not provided in the glass substrate 10. Also, the metal film 30 and the insulating film 90 are provided between the frame 20 and the glass substrate 10. Therefore, stress applied to the frame 20 when the frame 20 is attached to another member (for example, a housing 200 illustrated in FIG. 6) with screws is less likely to be transmitted to the glass substrate 10. Therefore, flatness of the glass substrate 10 can be maintained.

Note that, in the third embodiment, the metal plate 120 serving as a heat dissipation plate is provided in the opening portion 11. However, instead of the metal plate 120, an active component (not illustrated) having a heat dissipation function may be provided. The active component may be, for example, a microfluidic device or the like. In the active component, the heat dissipation temperature can actively be set, and the internal temperature distribution can be inclined. By doing so, the stress in the glass substrate 10 can be adjusted, and the flatness of the glass substrate 10 can be improved.

Fourth Embodiment

Figure 6:
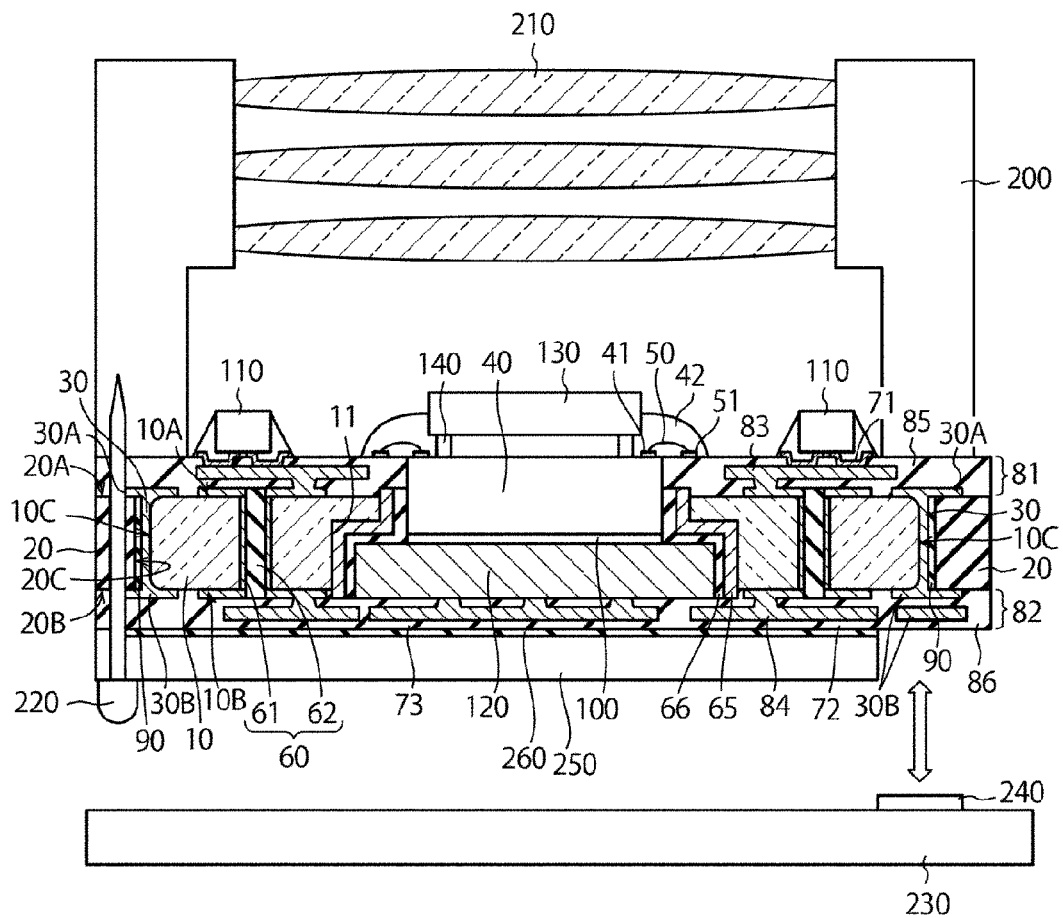
FIG. 6 is a schematic cross-sectional view illustrating a configuration example of a semiconductor device according to a fourth embodiment.

FIG. 6 is a schematic cross-sectional view illustrating a configuration example of a semiconductor device according to a fourth embodiment. The fourth embodiment is, for example, an embodiment in which the semiconductor device according to the third embodiment is used as a CMOS sensor module. In the fourth embodiment, the housing 200 is attached to the package according to the third embodiment with a screw 220. The housing 200 includes an optical lens 210. For the housing 200, an insulating resin material is used, for example. The housing 200 is formed substantially in the same shape as the outer shapes of the frame 20 and the glass substrate 10, and is formed in a quadrangular shape, for example. The screws 220 are inserted into the holes 150 to 152 in FIG. 4, respectively, and the frame 20 is attached and secured to the housing 200 with the screws 220. By doing so, the relative positional relationship between the semiconductor chip 40 and the optical lens 210 is determined. The optical lens 210 is provided to correspond to the light receiving surface of the semiconductor chip 40, and collects incident light onto the semiconductor chip 40. The semiconductor chip 40 generates an electric signal corresponding to the incident light (performs photoelectric conversion), and transmits the electric signal to another component.

The screws 220 may be inserted into the holes 150 to 152 through a metal plate 250 and a heat dissipation layer 260, and attach the metal plate 250 and the housing 200 to each other so as to sandwich the frame 20 therebetween. For the metal plate 250, a material having high heat conductivity such as copper and graphite is used, for example. For the heat dissipation layer 260, grease, an epoxy adhesive, or the like is used, for example.

The metal film 30 may function as an antenna. For example, as illustrated in FIG. 6, an antenna 240 may be provided on a motherboard 230, and signals may be wirelessly transmitted/received between the metal film 30 and the antenna 240. In this case, the metal plate 250 is not provided in the portion of the metal film 30 that performs the wireless communication. Also, the metal film 30 is electrically connected to the semiconductor chip 40 via the wirings 83 and 84, and can receive an electric signal from the semiconductor chip 40.

Fifth Embodiment

Figure 7:
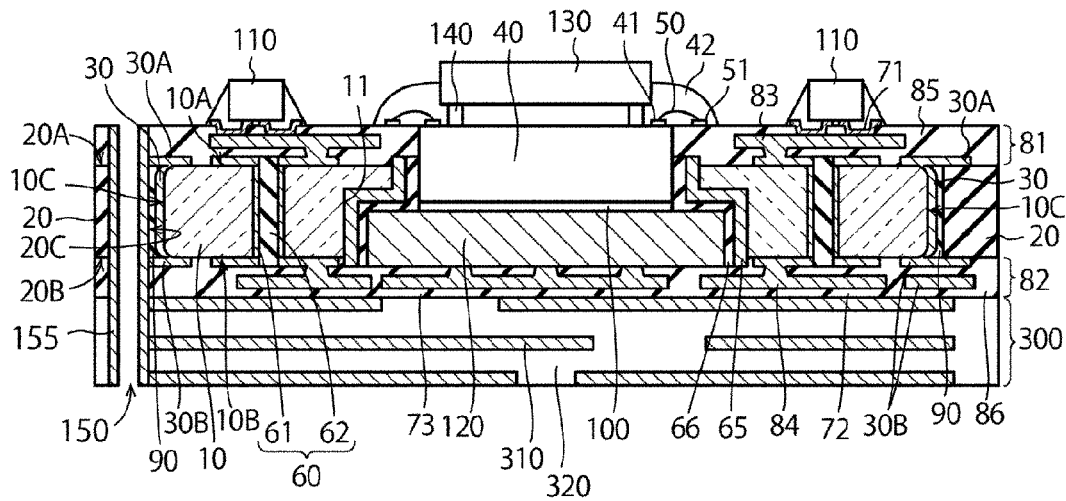
FIG. 7 is a schematic cross-sectional view illustrating a configuration example of a semiconductor device according to a fifth embodiment.

FIG. 7 is a schematic cross-sectional view illustrating a configuration example of a semiconductor device according to a fifth embodiment. In the fifth embodiment, each of the holes 150 to 152 of the package according to the third embodiment has a metal material on the inner wall thereof and is used as a through electrode. On the side of the glass substrate 10 provided with the second surface 10B, a wiring substrate 300 is provided. The wiring substrate 300 includes a plurality of wiring layers 310 and an interlayer insulating film 320 provided between the wiring layers 310. The wiring substrate 300 is provided so as to be opposed to the entire second surface 10B of the glass substrate 10 and the entire fourth surface 20B of the frame 20. That is, the wiring substrate 300 is bonded to the entire rear surface of the package.

The holes 150 to 152 are provided to penetrate both the frame 20 and the wiring substrate 300. Furthermore, the inner wall of each of the holes 150 to 152 is covered with a metal film 155 serving as a metal material, and the metal film 155 is electrically connected to a part of the metal film 30 and a part of the wiring layers 310. With the metal film 155, each of the holes 150 to 152 can function as a through electrode, and the metal film 30 can function as a wiring or an antenna. For the metal film 155, a low-resistance metal material such as copper is used, for example. Inside the metal film 155 of each of the holes 150 to 152, an insulating film (not illustrated) may be provided, or the screw 220 may be inserted.

Sixth Embodiment

Figure 8:
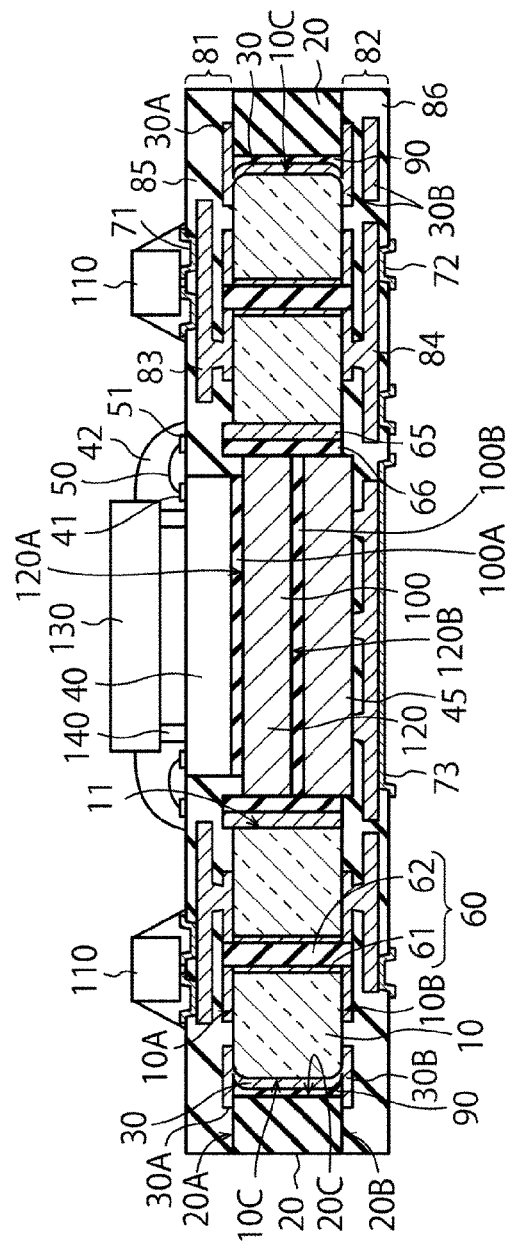
FIG. 8 is a schematic cross-sectional view illustrating a configuration example of a semiconductor device according to a sixth embodiment.

FIG. 8 is a schematic cross-sectional view illustrating a configuration example of a semiconductor device according to a sixth embodiment. In the sixth embodiment, a plurality of semiconductor chips 40 and 45 and the metal plate 120 are built in the opening portion 11 of the glass substrate 10. The inner wall of the opening portion 11 extends in a direction substantially perpendicular to the first surface 10A or the second surface 10B. The metal film 65 and an insulating film 66 are provided on the inner wall of the opening portion 11.

In the opening portion 11, the semiconductor chip 40 is bonded to one surface 120A of the metal plate 120 via an adhesive 100A. The semiconductor chip 45 is bonded to the other surface 120B of the metal plate 120 via an adhesive 100B. The semiconductor chip 40 may be, for example, a CMOS image sensor chip, and the semiconductor chip 45 may be, for example, a CMOS circuit that processes a signal from the semiconductor chip 40. In this manner, the package according to the present embodiment may be used as a multi-chip module.

Since glass has high processing accuracy, the thickness of the insulating film 66 can be reduced to bring the semiconductor chips 40 and 45 in the opening portion 11 of the glass substrate 10 close to the metal film 65. By doing so, the heat transfer effect from the side surfaces of the semiconductor chips 40 and 45 to the metal film 65 is improved, and heat can efficiently be dissipated. Also, the package according to the present embodiment can be used as a multi-chip module, and can be thin and compact.

Seventh Embodiment

Figure 9:
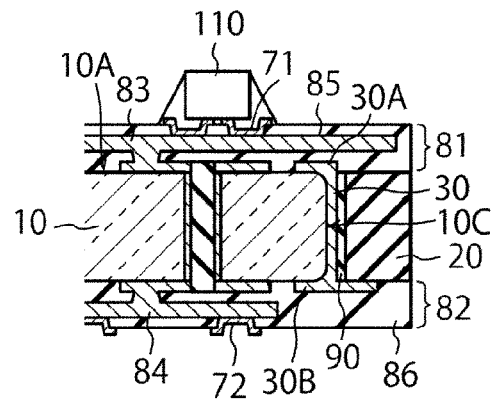
FIG. 9 is a schematic cross-sectional view illustrating a configuration example of a semiconductor device according to a seventh embodiment.

FIG. 9 is a schematic cross-sectional view illustrating a configuration example of a semiconductor device according to a seventh embodiment. Note that, in FIG. 9 and subsequent drawings, only the end portion of the semiconductor device is illustrated as appropriate. In the following drawings, only the end portion is illustrated as appropriate. In the seventh embodiment, the wiring 83 functions as an antenna, and the metal film 30 functions as a ground. The wiring 83 is insulated from the metal film 30 by the interlayer insulating film 85. The metal film 30 is arranged immediately below the wiring 83 functioning as an antenna and is grounded. Thus, the antenna gain of the wiring 83 can be improved. The other components of the seventh embodiment may be the same as those of any of the first to sixth embodiments. Note that the metal film 30A is provided on the first surface 10A of the glass substrate 10, but is not provided on the third surface 20A of the frame 20.

Figure 10:
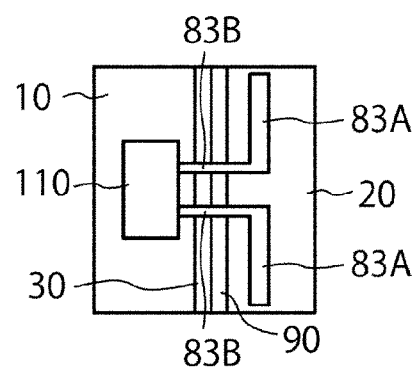
FIG. 10 is a diagram illustrating a planar layout of a wiring functioning as an antenna.
Figure 11A:
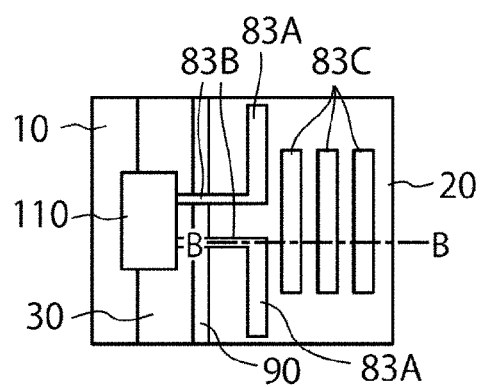
FIG. 11A is a diagram illustrating a planar layout of a wiring functioning as an antenna.
Figure 11B:
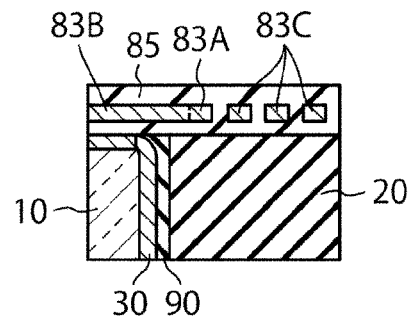
FIG. 11B is a cross-sectional view of the upper portion taken along line B-B in FIGS. 11A and 11B.
Figure 12A:
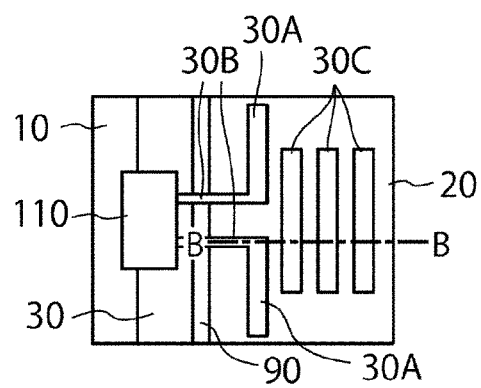
FIG. 12A is a diagram illustrating a planar layout of a wiring functioning as an antenna.
Figure 12B:
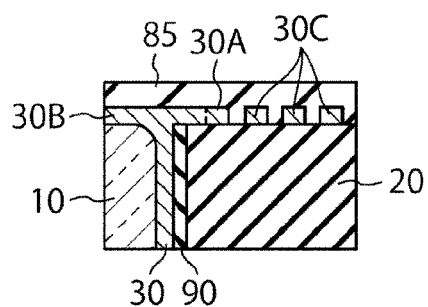
FIG. 12B is a cross-sectional view of the upper portion taken along line B-B in FIG. 12A.

FIGS. 10, 11A, and 12A are diagrams illustrating planar layouts of the wiring 83 functioning as an antenna. FIG. 11B is a cross-sectional view of the upper portion taken along line B-B in FIG. 11A. FIG. 12B is a cross-sectional view of the upper portion taken along line B-B in FIG. 12A.

As illustrated in FIG. 10, the wiring 83 may be a dipole antenna including two linear conductors. A wiring 83A constituting a radiation element of the dipole antenna is provided on the third surface 20A of the frame 20. The metal film 30 is grounded and functions as a reflective element.

Alternatively, as illustrated in FIGS. 11A and 11B, the wiring 83 may be a Yagi-Uda antenna. The wiring 83A serving as a radiation element is provided on the third surface 20A of the frame 20. The metal film 30 is grounded and functions as a reflective element.

As illustrated in FIGS. 12A and 12B, the metal film 30 may be used as a Yagi-Uda antenna.

Eighth Embodiment

Figure 13:
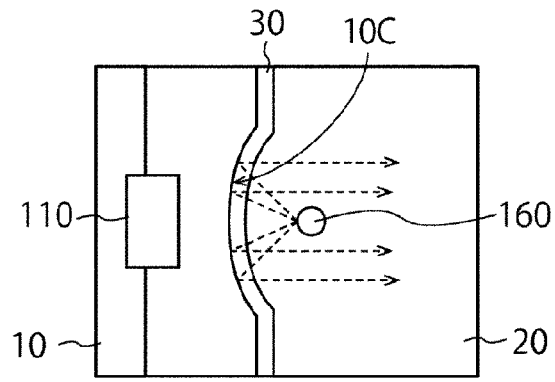
FIG. 13 is a schematic plan view illustrating a configuration example of a semiconductor device according to an eighth embodiment.

FIG. 13 is a schematic plan view illustrating a configuration example of a semiconductor device according to an eighth embodiment. In the eighth embodiment, the metal film 30 and a radiation element 160 constitute an antenna. The radiation element 160 is a conductor provided on the third surface 20A of the frame 20, and is supplied with power from the not-illustrated wiring 83. The side surface 10C of the glass substrate 10 covered with the metal film 30 has a curved surface centering on the radiation element 160. The metal film 30 covering the side surface 10C functions as a reflective element. By the curved surface of the side surface 10C, the directivity and the gain of the antenna can be adjusted. Note that, in FIG. 13, illustration of the insulating film 90 between the metal film 30 and the frame 20 is omitted.

Ninth Embodiment

Figure 14:
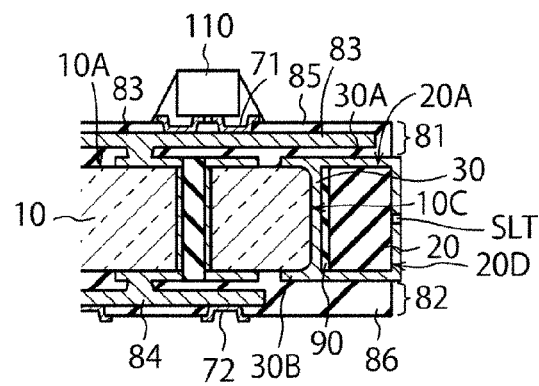
FIG. 14 is a schematic cross-sectional view illustrating a configuration example of a semiconductor device according to a ninth embodiment.

FIG. 14 is a schematic cross-sectional view illustrating a configuration example of a semiconductor device according to a ninth embodiment. In the ninth embodiment, the metal film 30 is provided on an outer side surface 20D of the frame 20 as well. The metal film 30 on the outer side surface 20D is referred to as a metal film 30C. The metal film 30C on the outer side surface 20D is provided with a slit SLT, and the metal film 30C functions as a slot antenna.

Figure 15A:
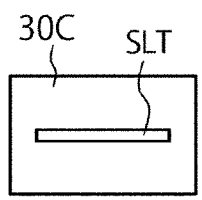
FIG. 15A is a side view illustrating an example of a slit of a metal film.
Figure 15B:
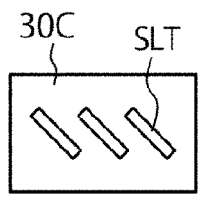
FIG. 15B is a side view illustrating an example of the slit of the metal film.

FIGS. 15A and 15B are side views illustrating examples of the slit SLT of the metal film 30C. The slit SLT of the metal film 30C may be one elongated slit as illustrated in FIG. 15A. Alternatively, the slit SLT of the metal film 30C may be a plurality of elongated slits arranged substantially in parallel as illustrated in FIG. 15B.

Such a slit SLT can be formed by plating the metal film 30C on the entire outer side surface 20D and then patterning the metal film 30C at the portion of the slit SLT using laser light irradiation or an etching technology. Alternatively, the surface region of the outer side surface 20D other than the slit SLT may be activated by laser light using a molded wiring device (MID) or the like to form the metal film 30C in the surface region.

In this manner, the metal film 30C functioning as an antenna may be provided on the outer side surface 20D of the frame 20. This facilitates wireless communication with an electronic device (not illustrated) in the vicinity of the semiconductor device.

Tenth Embodiment

Figure 16:
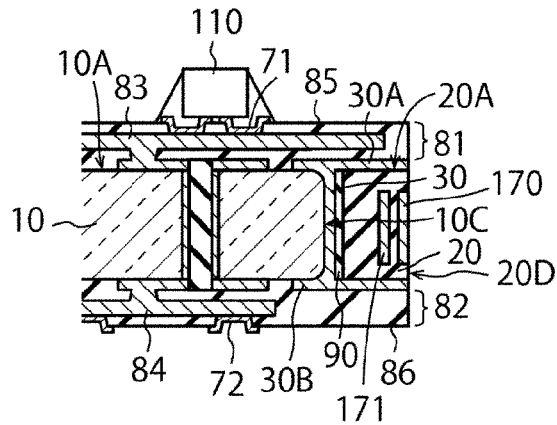
FIG. 16 is a schematic cross-sectional view illustrating a configuration example of a semiconductor device according to a tenth embodiment.

FIG. 16 is a schematic cross-sectional view illustrating a configuration example of a semiconductor device according to a tenth embodiment. In the tenth embodiment, metal films 170 and 171 are provided on the outer side surface 20D of the frame 20 and in the frame 20. The metal films 170 and 171 are electrically connected to the wirings 83 and 84 or the metal film 30, and function as an antenna. Alternatively, the metal films 170 and 171 may be used as waveguide elements 83C or 30C of the Yagi-Uda antenna illustrated in FIG. 11A or 12A. Moreover, the metal film 170 may be provided with the slit SLT and used as a slot antenna.

Eleventh Embodiment

Figure 17A:
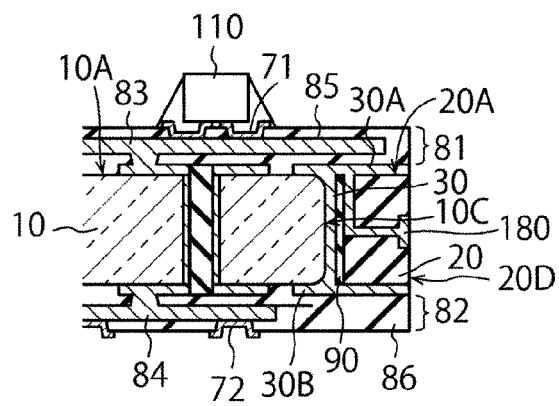
FIG. 17A is a schematic cross-sectional view illustrating a configuration example of a semiconductor device according to an eleventh embodiment.

FIG. 17A is a schematic cross-sectional view illustrating a configuration example of a semiconductor device according to an eleventh embodiment. In the eleventh embodiment, a metal film 180 is built in the frame 20 and exposed from the outer side surface 20D of the frame 20. The metal film 180 may be on the same plane as the outer side surface 20D. The metal film 180 is connected to the metal film 30. The metal film 180 may include the same material as that for the metal film 30.

Figure 17B:
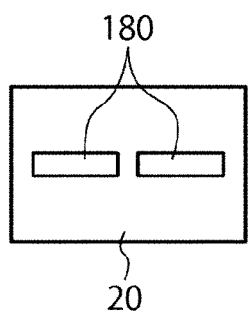
FIG. 17B is a side view of the semiconductor device according to the eleventh embodiment as viewed from an outer side surface of a frame.

FIG. 17B is a side view of the semiconductor device according to the eleventh embodiment as viewed from the outer side surface 20D of the frame 20. As illustrated in FIG. 17B, the metal film 180 constitutes a radiation element of a dipole antenna. The planar layout of the metal film 180 may be the same as the planar layout of the wiring 83A illustrated in FIG. 10A.

The above antenna may include a fed antenna or a parasitic antenna. Also, the above antenna may be used in any of the first to sixth embodiments. By doing so, the effect of the above antenna can be obtained in the first to sixth embodiments as well.

Manufacturing Method of Third Embodiment

Next, a method for manufacturing the semiconductor device according to the third embodiment will be described.

Figure 18:
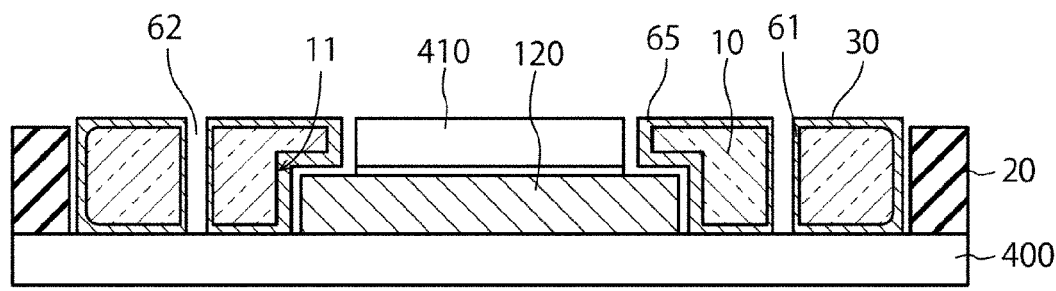
FIG. 18 is a cross-sectional view illustrating an example of a method for manufacturing the semiconductor device according to the third embodiment.

FIGS. 18 to 22 are cross-sectional views illustrating an example of the method for manufacturing the semiconductor device according to the third embodiment. First, as illustrated in FIG. 18, the frame 20, the glass substrate 10, and the metal plate 120 are mounted on a support substrate 400. As necessary, the glass substrate 10 is provided with the opening portion 11, and is provided with the metal films 30, 61, and 65 by means of plating processing or the like. Subsequently, a dummy member 410 is temporarily arranged at a position on the metal plate 120 at which the semiconductor chip 40 is to be provided.

Figure 19:
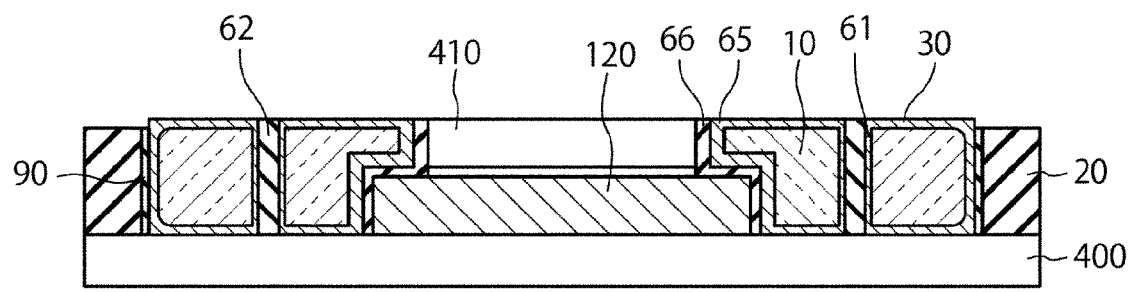
FIG. 19 is a cross-sectional view illustrating the example of the manufacturing method subsequent to FIG. 18.

Subsequently, as illustrated in FIG. 19, the insulating films 62, 66, and 90 are provided on the inner side of the metal film 61 of the glass substrate 10, in the gap between the glass substrate 10 and the metal plate 120, in the gap between the glass substrate 10 and the frame 20, and the like. The insulating films 62, 66, and 90 are, for example, epoxy resin or the like, and bond the glass substrate 10, the metal plate 120, and the frame 20 to each other.

Figure 20:
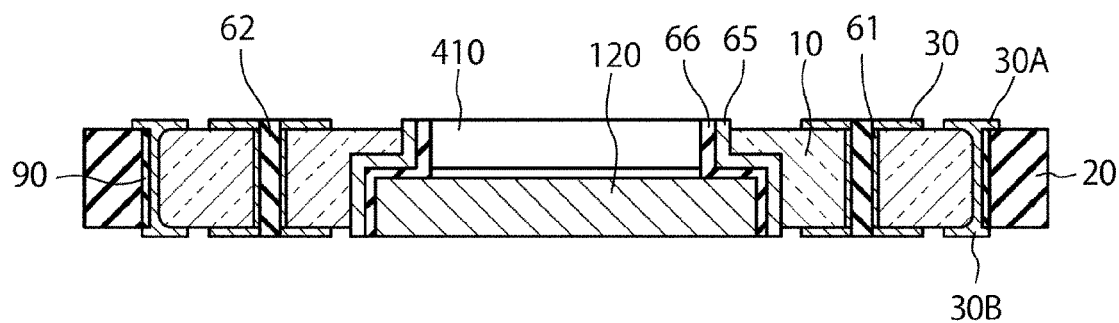
FIG. 20 is a cross-sectional view illustrating the example of the manufacturing method subsequent to FIG. 19.

Subsequently, the metal films 30A and 30B are formed on the glass substrate 10 and the frame 20 by means of plating processing or the like. Subsequently, as illustrated in FIG. 20, the metal films 30, 61, and 65 are patterned using a lithography technology and an etching technology. Alternatively, the plating processing of the metal films 30A and 30B may be partial plating processing using a mask or the like. Note that the support substrate 400 is removed from the glass substrate 10 before or after patterning of the metal films 30, 61, and 65.

Figure 21:
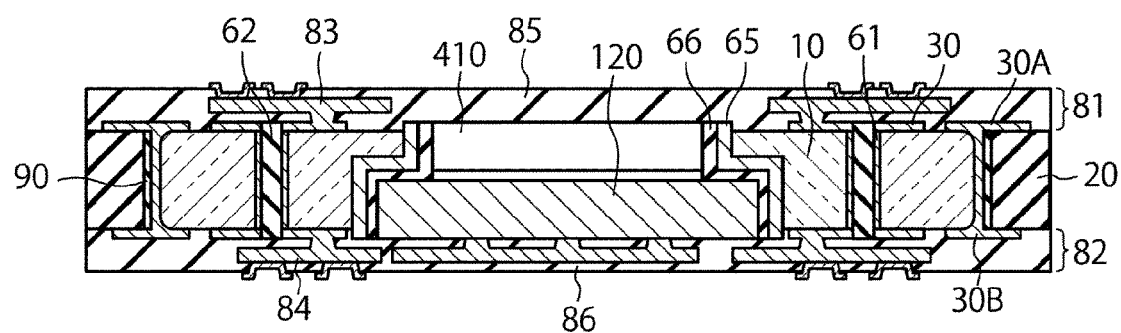
FIG. 21 is a cross-sectional view illustrating the example of the manufacturing method subsequent to FIG. 20.

Subsequently, as illustrated in FIG. 21, the stacked wiring portions 81 and 82 are formed on the first surface 10A and the second surface 10B of the glass substrate 10. The wirings 83 and 84 may be provided as multilayer wirings insulated by the interlayer insulating films 85 and 86.

Figure 22:
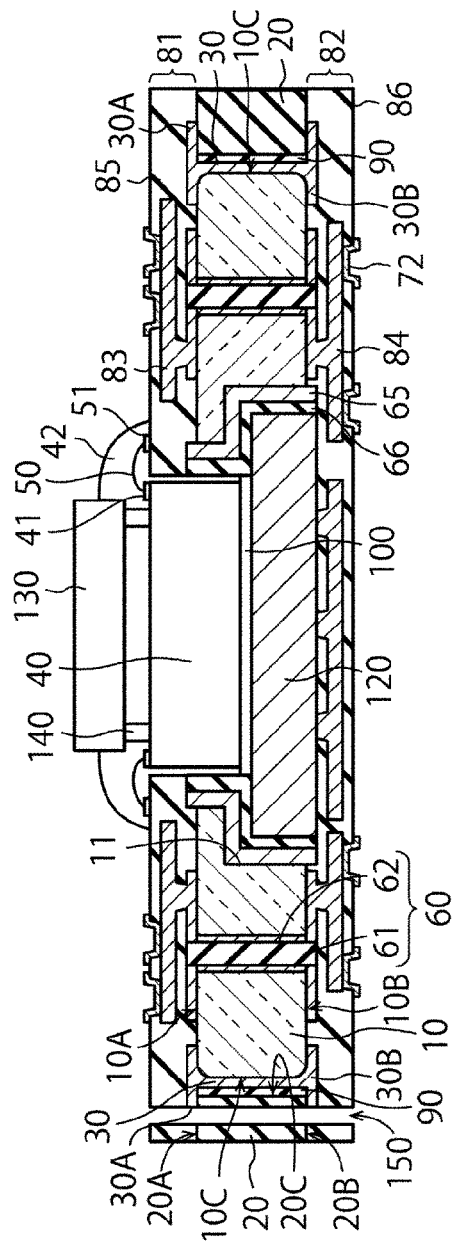
FIG. 22 is a cross-sectional view illustrating the example of the manufacturing method subsequent to FIG. 21.

Subsequently, as illustrated in FIG. 22, the hole 150 is formed, the dummy member 410 is removed, and the semiconductor chip 40 is bonded onto the metal plate 120. By doing so, the dummy member 410 is replaced with the semiconductor chip 40. The cover glass 130 is attached to the semiconductor chip 40 in advance by the rib 140. Thereafter, the bonding wire 50 is connected between the bonding pad 41 of the semiconductor chip 40 and the bonding pad 51 of the stacked wiring portion 81. In addition, the protective resin 42 is formed so as to cover the bonding wire 50. As a result, the structure illustrated in FIG. 5 is obtained.

Thereafter, an assembly process is performed, and a CMOS image sensor module as illustrated in FIG. 6 can thus be formed.

Modification Examples of CMOS Image Sensor Module

FIGS. 23 to 30 are schematic cross-sectional views illustrating modification examples of the semiconductor device according to the fourth embodiment. Each of FIGS. 23 to 30 may be a CMOS image sensor module. A semiconductor device 1 indicated by the broken line frame may be the semiconductor device according to any one of the above embodiments.

First Modification Example

Figure 23:
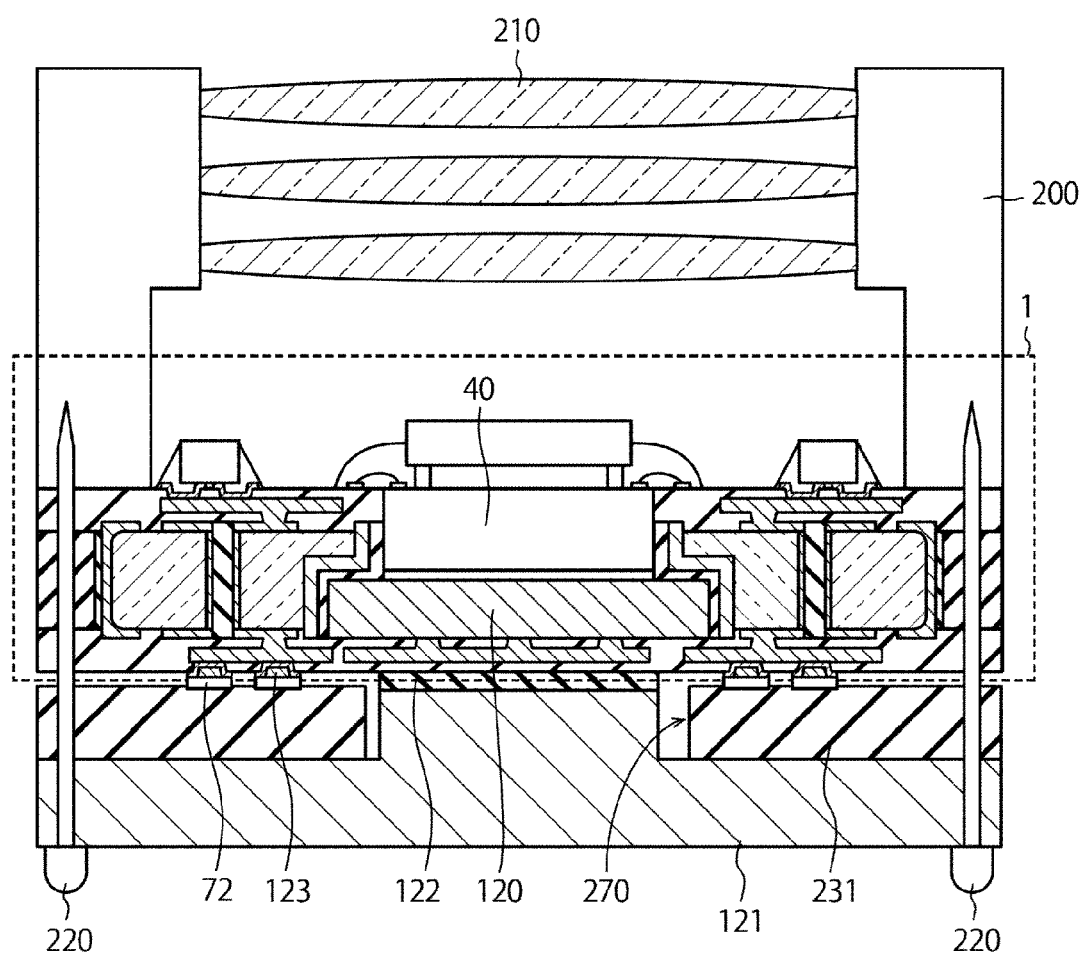
FIG. 23 is a cross-sectional view illustrating a modification example of the semiconductor device according to the fourth embodiment.

In the module illustrated in FIG. 23, a motherboard 231 has an opening portion 270 in a region thereof corresponding to the metal plate 120 and the semiconductor chip 40. A metal plate 121 is provided on the rear surface of the motherboard 231 and inside the opening portion 270. The metal plate 121 is bonded at an adhesive layer 122 thereof to the semiconductor device 1 through the opening portion 270. For the metal plate 121, as well as for the metal plate 120, a material having high heat conductivity such as copper is used, for example. For the adhesive layer 122, heat dissipation grease, epoxy resin, or the like is used, for example.

The motherboard 231 is connected to the electrode pad 72 of the semiconductor device 1 by a land grid array 123. Although not illustrated, the motherboard 231 may perform wireless communication using an antenna of the semiconductor device 1.

The screw 220 penetrates the metal plate 121, the motherboard 231, and the frame 20 of the semiconductor device 1 and reaches the housing 200. As a result, the metal plate 121, the motherboard 231, the semiconductor device 1, and the housing 200 are relatively secured as an integrated CMOS image sensor module.

Such a CMOS image sensor module can be incorporated in, for example, a camera. In this case, the metal plate 121 is physically connected to a housing (not illustrated) of the camera, and heat dissipation performance can be improved.

Second Modification Example

Figure 24:
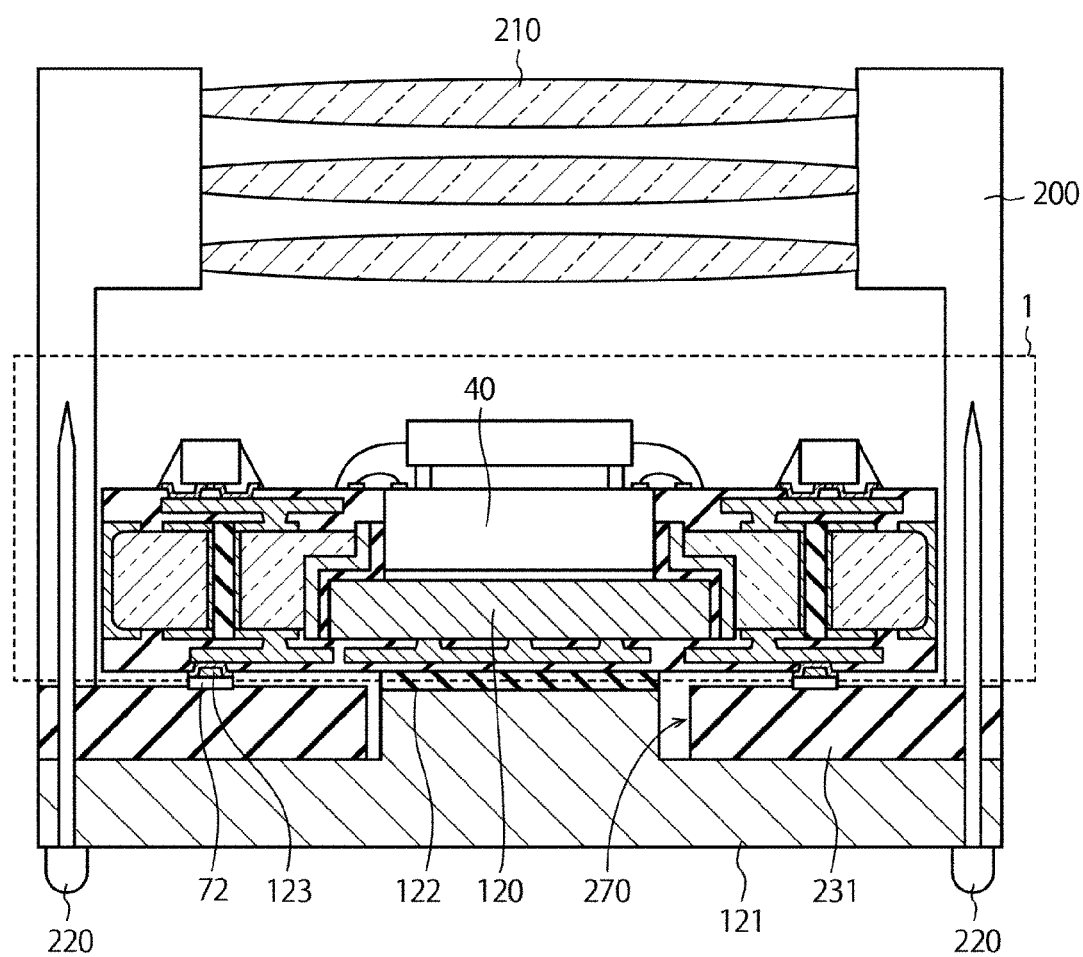
FIG. 24 is a schematic cross-sectional view illustrating a modification example of the semiconductor device according to the fourth embodiment.

In the module illustrated in FIG. 24, the screw 220 penetrates the metal plate 121 and the motherboard 231 and reaches the housing 200 without penetrating the semiconductor device 1. As a result, the metal plate 121, the motherboard 231, and the housing 200 are relatively secured. The semiconductor device 1 is not secured by the screw 220, but is secured to the metal plate 121 and the motherboard 231 by the adhesive layer 122 or the land grid array 123. As a result, the metal plate 121, the motherboard 231, the semiconductor device 1, and the housing 200 are relatively secured as an integrated CMOS image sensor module. The other components of the second modification example may be similar to the corresponding components of the first modification example. Therefore, the second modification example can exert similar effects to those of the first modification example.

Third Modification Example

Figure 25:
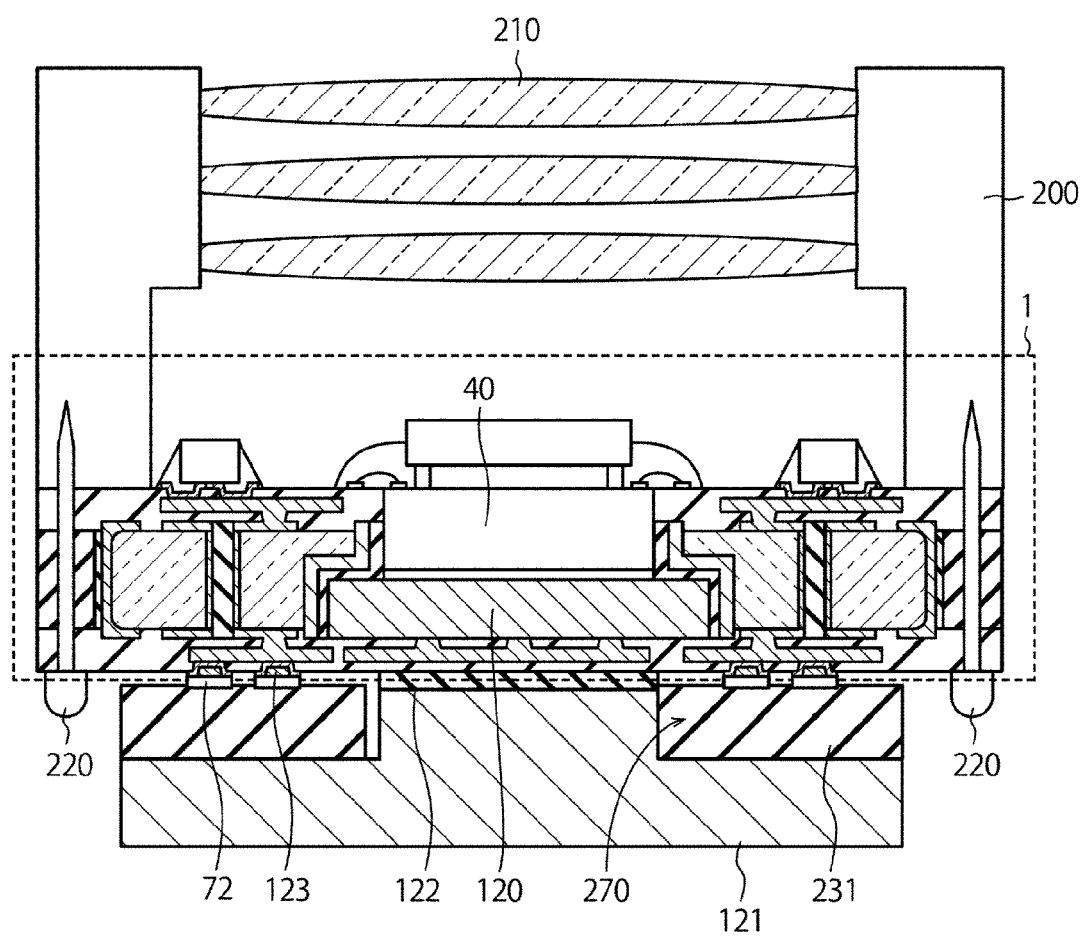
FIG. 25 is a schematic cross-sectional view illustrating a modification example of the semiconductor device according to the fourth embodiment.

In the module illustrated in FIG. 25, the screw 220 penetrates the semiconductor device 1 and reaches the housing 200 without penetrating the metal plate 121 and the motherboard 231. As a result, the semiconductor device 1 and the housing 200 are relatively secured. The metal plate 121 and the motherboard 231 are not secured by the screw 220, but are secured to the semiconductor device 1 by the adhesive layer 122 or the land grid array 123. As a result, the metal plate 121, the motherboard 231, the semiconductor device 1, and the housing 200 are relatively secured as an integrated CMOS image sensor module. The other components of the third modification example may be similar to the corresponding components of the first modification example. Therefore, the third modification example can exert similar effects to those of the first modification example.

Fourth Modification Example

Figure 26:
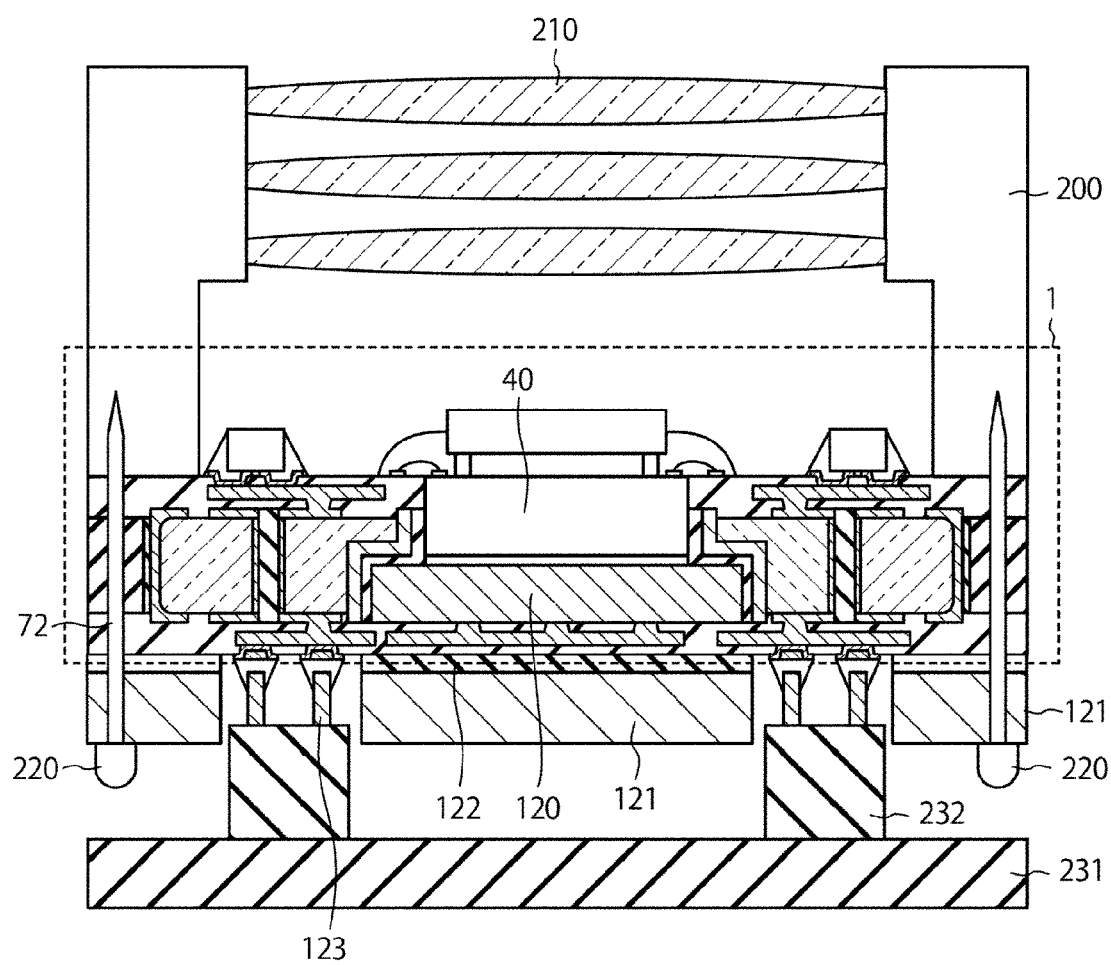
FIG. 26 is a schematic cross-sectional view illustrating a modification example of the semiconductor device according to the fourth embodiment.

In the module illustrated in FIG. 26, the metal plate 121 is bonded to the semiconductor device 1 at the adhesive layer 122 and is directly attached with the screw 220. As a result, the metal plate 121, the semiconductor device 1, and the housing 200 are relatively secured.

Also, the motherboard 231 is provided below the metal plate 121 and includes a pin socket 232. The semiconductor device 1 includes a pin grid array 124 electrically connected to the stacked wiring portion 82. By inserting the pin grid array 124 of the semiconductor device 1 into the pin socket 232 of the motherboard 231, the semiconductor device 1 is electrically connected to the motherboard 231 and secured to the motherboard 231.

As a result, the metal plate 121, the motherboard 231, the semiconductor device 1, and the housing 200 are relatively secured as an integrated CMOS image sensor module. The other components of the fourth modification example may be similar to the corresponding components of the first modification example. Therefore, the fourth modification example can exert similar effects to those of the first modification example.

Fifth Modification Example

Figure 27:
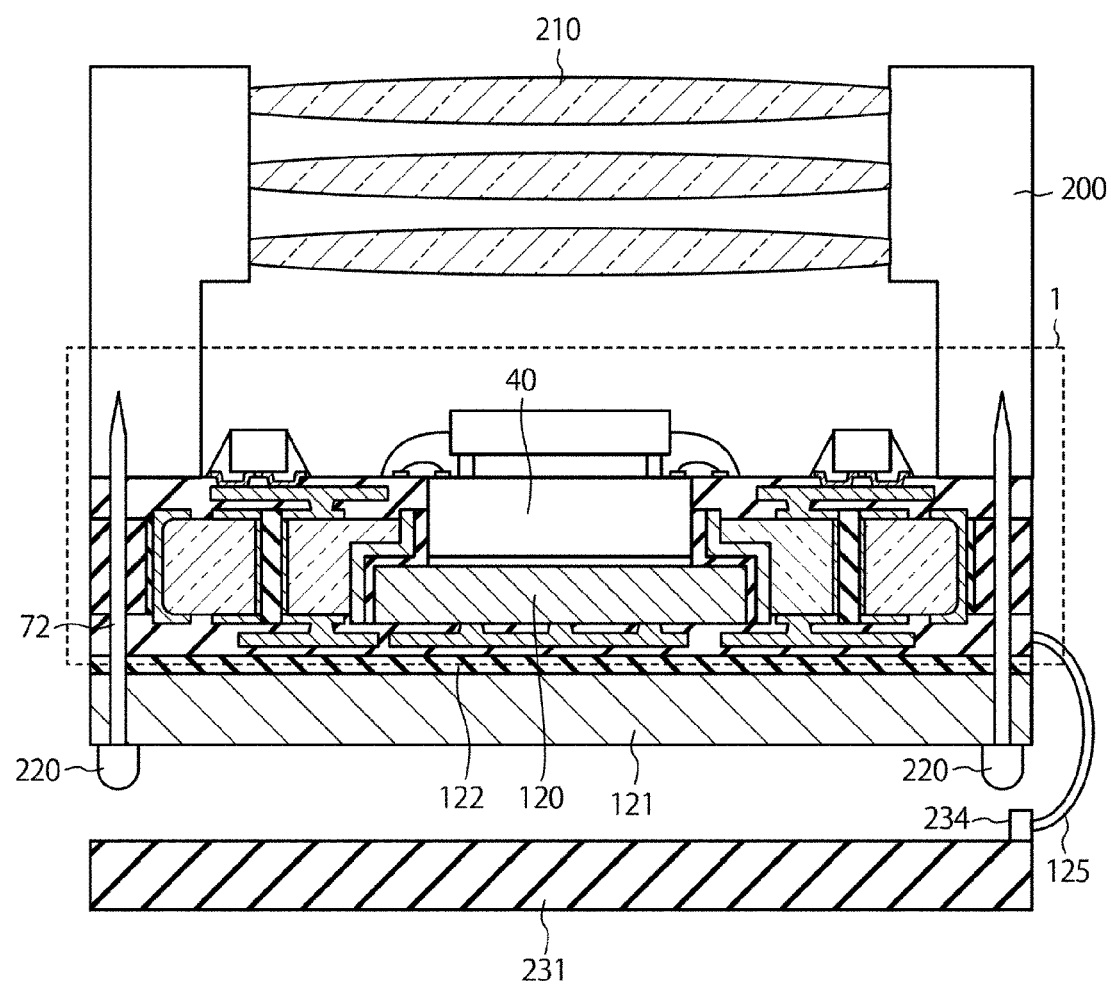
FIG. 27 is a schematic cross-sectional view illustrating a modification example of the semiconductor device according to the fourth embodiment.

In the module illustrated in FIG. 27, the metal plate 121 is bonded to the semiconductor device 1 at the adhesive layer 122 and is directly attached with the screw 220. As a result, the metal plate 121, the semiconductor device 1, and the housing 200 are relatively secured.

Also, the motherboard 231 is provided below the metal plate 121 and includes a flexible connector 234. The semiconductor device 1 includes a flexible structure 125 formed integrally with the stacked wiring portion 82. For the flexible connector 234 and the flexible structure 125, a low-resistance metal material such as copper is used, for example. Therefore, the flexible connector 234 and the flexible structure 125 can be used as wirings between the motherboard 231 and the semiconductor device 1.

Also, the semiconductor device 1 is flexibly connected to the motherboard 231 by the flexible connector 234 and the flexible structure 125. As a result, the metal plate 121, the motherboard 231, the semiconductor device 1, and the housing 200 constitute an integrated CMOS image sensor module, but the semiconductor device 1 can move relatively to the motherboard 231 to some extent. The other components of the fifth modification example may be similar to the corresponding components of the first modification example. Therefore, the fifth modification example can exert similar effects to those of the first modification example.

Sixth Modification Example

Figure 28:
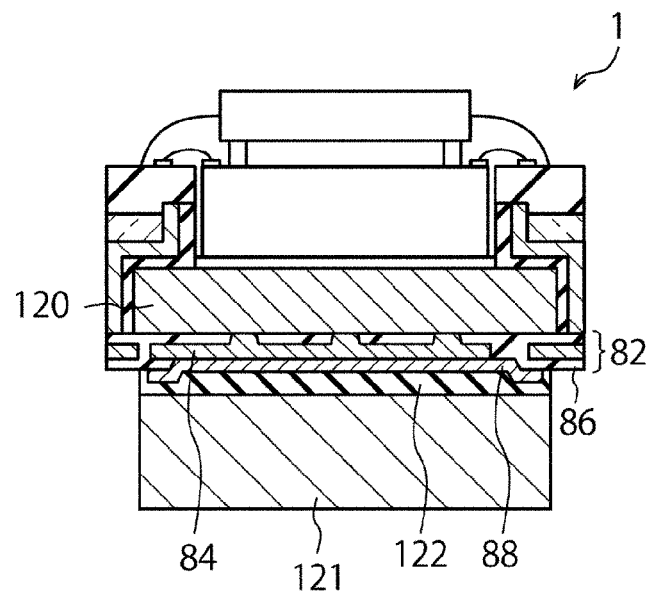
FIG. 28 is a schematic cross-sectional view illustrating a modification example of the semiconductor device according to the fourth embodiment.

The semiconductor device 1 illustrated in FIG. 28 includes a metal layer 88 provided between the metal plate 121 and the wiring 84. The metal layer 88 is connected to the wiring 84. The metal layer 88 is fixed at a predetermined potential (for example, the ground potential). For the metal layer 88, a conductive material having high heat conductivity such as nickel and copper is used, for example. The metal layer 88 can improve heat conductivity between the metal plate 120 and the metal plate 121. The metal layer 88 is electrically connected to the metal plate 120 via the wiring 84, and can fix the metal plate 120 at a predetermined potential (for example, the ground potential). In addition, the metal layer 88 improves the mechanical strength of the stacked wiring portion 82 and has an electromagnetic shielding effect of protecting the semiconductor device 1 from external noise.

The metal layer 88 may be applied to any of the first to fifth modification examples. Therefore, the sixth modification example can exert similar effects to those of any of the first to fifth modification examples.

Seventh Modification Example

Figure 29:
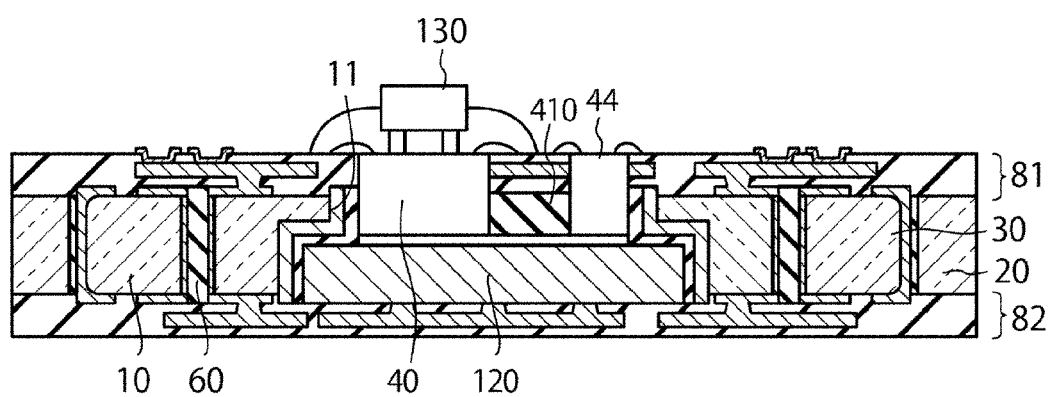
FIG. 29 is a schematic cross-sectional view illustrating a modification example of the semiconductor device according to the fourth embodiment.

FIG. 29 is a schematic cross-sectional view illustrating a configuration example of a multi-chip module in which a plurality of semiconductor chips 40 and 44 is mounted on the same metal plate 120. In the sixth modification example, the metal plate 120 functions as a common heat dissipation plate to the plurality of semiconductor chips 40 and 44. Therefore, the plurality of semiconductor chips 40 and 44 is provided in the same opening portion 11. The semiconductor chips 40 and 44 are not particularly limited, but the semiconductor chip 40 is, for example, a Time-of-Flight light emitting and receiving device (that is, a photodiode sensor). The semiconductor chip 44 may be, for example, a vertical cavity surface emitting laser (VCSEL). The dummy member 410 may be left between the semiconductor chip 40 and the semiconductor chip 44. The other components of the sixth modification example may be similar to the corresponding components of the third embodiment illustrated in FIG. 5.

Eighth Modification Example

Figure 30:
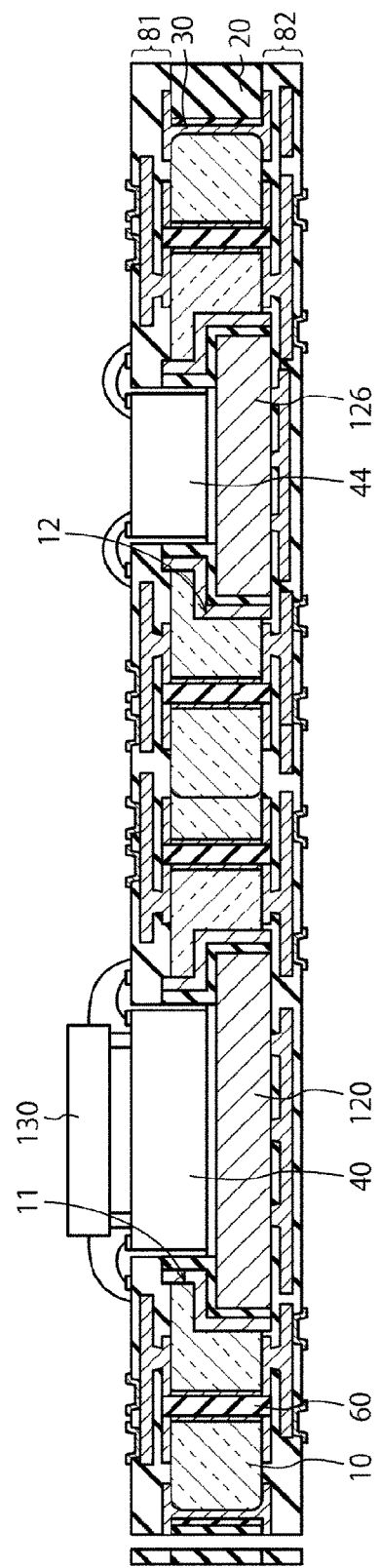
FIG. 30 is a schematic cross-sectional view illustrating a modification example of the semiconductor device according to the fourth embodiment.

FIG. 30 is a schematic cross-sectional view illustrating a configuration example of a multi-chip module in which the semiconductor chip 40 and the semiconductor chip 44 are mounted on separate metal plates 120 and 126, respectively. In the seventh modification example, the metal plate 120 functions as a heat dissipation plate for the semiconductor chip 40, and the metal plate 126 functions as a heat dissipation plate for the semiconductor chip 44. Therefore, the plurality of semiconductor chips 40 and 44 is provided in separate opening portions 11 and 12, respectively. The other components of the sixth modification example may be similar to the corresponding components of the third embodiment illustrated in FIG. 5.

Figure 31:
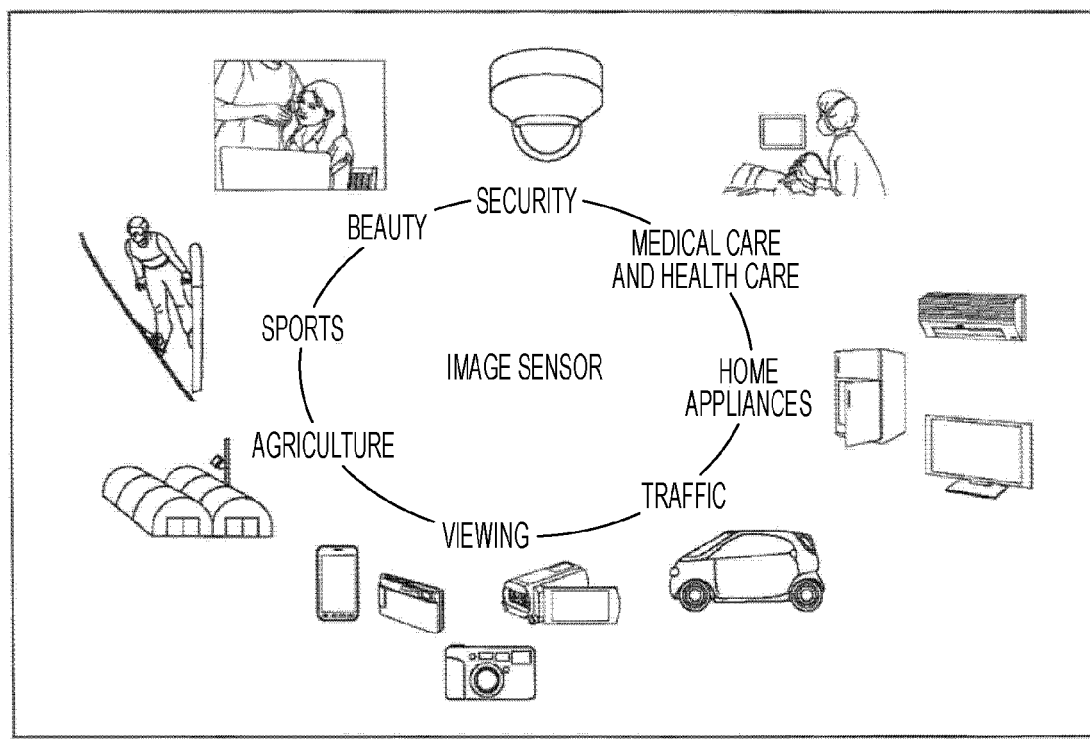
FIG. 31 is a diagram illustrating examples in which any of the embodiments according to the present technology is used as a CMOS image sensor.

15. Use Example of Image Capturing Device to which Present Technology is Applied FIG. 31 is a diagram illustrating examples in which any of the embodiments according to the present technology is used as a CMOS image sensor.

An image capturing device according to any of the above embodiments can be used, for example, in various cases of sensing light such as visible light, infrared light, ultraviolet light, and X-rays as follows. That is, as illustrated in FIG. 31, for example, any of the above embodiments can be used in a device used in a field of viewing in which an image provided for viewing is captured, a field of traffic, a field of home appliances, a field of medical care and health care, a field of security, a field of beauty, a field of sports, a field of agriculture, and the like.

Specifically, in the field of viewing, for example, any of the above embodiments can be used for a device for capturing an image to be provided for viewing, such as a digital camera, a smartphone, and a mobile phone with a camera function.

In the field of traffic, for example, any of the above embodiments can be used for a device to be provided for traffic, such as an in-vehicle sensor that captures images of the front, rear, surroundings, inside, and the like of an automobile, a monitoring camera that monitors traveling vehicles and roads, and a distance measuring sensor that measures a distance between vehicles and the like, for safe driving such as automatic stop, recognition of driver's condition, and the like.

In the field of home appliances, for example, any of the above embodiments can be used for a device to be provided in home appliances such as a television receiver, a refrigerator, and an air conditioner in order to capture an image of a gesture of a user and operate the home appliances in accordance with the gesture.

In the field of medical care and health care, for example, any of the above embodiments can be used for a device to be provided for medical care and health care, such as an endoscope and a device that performs angiography by receiving infrared light.

In the field of security, for example, any of the above embodiments can be used for a device to be provided for security, such as a monitoring camera for crime prevention and a camera for person authentication.

In the field of beauty, for example, any of the above embodiments can be used for a device to be provided for beauty, such as a skin measuring instrument for capturing an image of the skin and a microscope for capturing an image of the scalp.

In the field of sports, for example, any of the above embodiments can be used for a device to be provided for sports, such as an action camera and a wearable camera for sports applications and the like.

In the field of agriculture, for example, any of the above embodiments can be used for a device to be provided for agriculture, such as a camera for monitoring the condition of fields and crops.

The present technology can be applied to various other products.

Embodiments of the present technology are not limited to the above embodiments, and various changes can be made without departing from the scope of the present technology.

Also, effects described in the present description are illustrative only and shall not be limited, and other effects may exist.

Also, the present technology can employ the following configuration.

(1)

A semiconductor device including:
- a glass substrate that includes a first surface, a second surface provided on the opposite side of the first surface, and a first side surface provided between the first surface and the second surface;
- a wiring that is provided on the first and second surfaces;
- a metal film that covers the first side surface; and
- a frame that is provided further on the outer side than the metal film, and that is bonded to the metal film at the first side surface.

(2)

The semiconductor device according to (1), in which the metal film includes the same material as that for the wiring.

(3)

The semiconductor device according to (1) or (2),
in which the metal film is provided on a side provided with the first surface and a side provided with the second surface from the glass substrate to the frame to cover both the glass substrate and the frame.

(4)

The semiconductor device according to any one of (1) to (3),
in which the frame includes a third surface provided on the side provided with the first surface, a fourth surface provided on the side provided with the second surface, and a second side surface provided between the third surface and the fourth surface and opposed to the first side surface, and
the metal film is provided from the first surface to the third surface and is provided from the second surface to the fourth surface at a boundary portion between the glass substrate and the frame.

(5)

The semiconductor device according to (4),
in which the height difference between the first surface and the third surface and the height difference between the second surface and the fourth surface are each smaller than the thickness of the metal film.

(6)

The semiconductor device according to (4) or (5),
in which the frame has a hole penetrating from the third surface to the fourth surface.

(7)

The semiconductor device according to (6),
in which the inner wall of the hole is covered with a metal material, and the metal material is electrically connected to the wiring or the metal film.

(8)

The semiconductor device according to (6),
in which a screw is provided in the hole, and the screw attaches the frame and the housing to each other.

(9)

The semiconductor device according to any one of (1) to (8),
in which the metal film is used as an antenna for wireless communication.

(10)

The semiconductor device according to any one of (1) to (8),
in which the wiring is used as an antenna for wireless communication, and
the metal film is used as a ground.

(11)

The semiconductor device according to any one of (1) to (10),
in which the metal film is provided on an outer side surface of the frame and is used as an antenna for wireless communication.

(12)

The semiconductor device according to (1)1,
in which the metal film provided on the outer side surface of the frame is used as a slot antenna having one or a plurality of slits.

(13)

The semiconductor device according to any one of (1) to (12),
in which a semiconductor chip is mounted on the first surface of the glass substrate.

(14)

The semiconductor device according to any one of (1) to (13),
in which the glass substrate includes an opening portion penetrating from the first surface to the second surface, and
a metal plate and a semiconductor chip provided on the metal plate are provided in the opening portion.

(15)

The semiconductor device according to (14),
in which the metal plate is a heat dissipation plate, and the semiconductor chip is an image sensor chip.

(16)

The semiconductor device according to (15),
in which the frame includes a third surface provided on a side provided with the first surface and a fourth surface provided on a side provided with the second surface, and includes a hole penetrating from the third surface to the fourth surface,
a screw provided in the hole attaches the frame and a housing to each other, and
the housing is provided with an optical lens, and the optical lens collects light onto the image sensor chip.

Note that the present disclosure is not limited to the above embodiments, and that various changes can be made without departing from the scope of the present disclosure. Also, effects described in the present description are illustrative only and shall not be limited, and other effects may exist.

REFERENCE SIGNS LIST

10 Glass substrate
11 Opening portion
20 Frame
30 Metal film
40 Semiconductor chip
50 Bonding wire
81, 82 Stacked wiring portion
90 Insulating film

The invention claimed is:

1. A semiconductor device comprising:
a glass substrate that includes a first surface, a second surface provided on an opposite side of the first surface, and a first side surface provided between the first surface and the second surface;

a wiring that is provided on the first and second surfaces;
a metal film that covers the first side surface; and
a frame that is provided further on an outer side than the metal film, and that is bonded to the metal film at the first side surface.

2. The semiconductor device according to claim 1, wherein the metal film includes a same material as that for the wiring.

3. The semiconductor device according to claim 1, wherein the metal film is provided on a side provided with the first surface and a side provided with the second surface from the glass substrate to the frame to cover both the glass substrate and the frame.

4. The semiconductor device according to claim 3, wherein the frame includes a third surface provided on the side provided with the first surface, a fourth surface provided on the side provided with the second surface, and a second side surface provided between the third surface and the fourth surface and opposed to the first side surface, and
the metal film is provided from the first surface to the third surface and is provided from the second surface to the fourth surface at a boundary portion between the glass substrate and the frame.

5. The semiconductor device according to claim 4, wherein a height difference between the first surface and the third surface and a height difference between the second surface and the fourth surface are each smaller than a thickness of the metal film.

6. The semiconductor device according to claim 4, wherein the frame has a hole penetrating from the third surface to the fourth surface.

7. The semiconductor device according to claim 6, wherein an inner wall of the hole is covered with a metal material, and the metal material is electrically connected to the wiring or the metal film.

8. The semiconductor device according to claim 6, wherein a screw is provided in the hole, and the screw attaches the frame and a housing to each other.

9. The semiconductor device according to claim 1, wherein the metal film is used as an antenna for wireless communication.

10. The semiconductor device according to claim 1, wherein the wiring is used as an antenna for wireless communication, and
the metal film is used as a ground.

11. The semiconductor device according to claim 1, wherein the metal film is provided on an outer side surface of the frame and is used as an antenna for wireless communication.

12. The semiconductor device according to claim 11, wherein the metal film provided on the outer side surface of the frame is used as a slot antenna having one or a plurality of slits.

13. The semiconductor device according to claim 1, wherein a semiconductor chip is mounted on the first surface of the glass substrate.

14. The semiconductor device according to claim 1, wherein the glass substrate includes an opening portion penetrating from the first surface to the second surface, and
a metal plate and a semiconductor chip provided on the metal plate are provided in the opening portion.

15. The semiconductor device according to claim 14, wherein the metal plate is a heat dissipation plate, and
the semiconductor chip is an image sensor chip.

16. The semiconductor device according to claim 15, wherein the frame includes a third surface provided on a side provided with the first surface and a fourth surface provided on a side provided with the second surface, and includes a hole penetrating from the third surface to the fourth surface,
a screw provided in the hole attaches the frame and a housing to each other, and
the housing is provided with an optical lens, and the optical lens collects light onto the image sensor chip.

* * * * *